(12) United States Patent
Reineke et al.

(10) Patent No.: US 8,546,816 B2
(45) Date of Patent: *Oct. 1, 2013

(54) LIGHT-EMITTING COMPONENT AND METHOD FOR THE PRODUCTION THEREOF

(75) Inventors: Sebastian Reineke, Dresden (DE); Gregor Schwartz, Dresden (DE); Karl Leo, Dresden (DE); Karsten Walzer, Dresden (DE)

(73) Assignee: Novaled AG, Dresden (DE)

( * ) Notice: Subject to any disclaimer, the term of this patent is extended or adjusted under 35 U.S.C. 154(b) by 702 days.

This patent is subject to a terminal disclaimer.

(21) Appl. No.: 12/598,080

(22) PCT Filed: Apr. 30, 2008

(86) PCT No.: PCT/DE2008/000732
§ 371 (c)(1),
(2), (4) Date: Apr. 5, 2010

(87) PCT Pub. No.: WO2008/131750
PCT Pub. Date: Nov. 6, 2008

(65) Prior Publication Data
US 2011/0156059 A1    Jun. 30, 2011

(30) Foreign Application Priority Data

Apr. 30, 2007 (DE) .......................... 10 2007 020 644
Jul. 11, 2007 (DE) .......................... 10 2007 033 209
Dec. 14, 2007 (DE) .......................... 10 2007 061 755

(51) Int. Cl.
*H01L 27/15* (2006.01)

(52) U.S. Cl.
USPC ..................................... 257/79; 257/E33.061

(58) Field of Classification Search
USPC ............................................. 257/E33.061, 79
See application file for complete search history.

(56) References Cited

U.S. PATENT DOCUMENTS

| 7,986,090 B2* | 7/2011 | Pfeiffer et al. ............... 313/504 |
| 2003/0099860 A1 | 5/2003 | Lin et al. |
| 2006/0078757 A1 | 4/2006 | Boerner |
| 2009/0230844 A1 | 9/2009 | Pfeiffer et al. |

FOREIGN PATENT DOCUMENTS

| WO | 2006060251 A1 | 6/2006 |
| WO | 2006130883 A2 | 12/2006 |

OTHER PUBLICATIONS

Baldo, et al. "Highly efficient phosphorescent emission from organic electroluminescent devices," Nature, vol. 395, Sep. 10, 1998, pp. 151-154.
Baldo, M. A., et al., "Transient analysis of organic electrophosphorescence II. Transient analysis of triplet-triplet annihilation," Physical Review B, (2000), vol. 62:16, pp. 10967-10977.

(Continued)

*Primary Examiner* — Marvin Payen
(74) *Attorney, Agent, or Firm* — Sutherland Asbill & Brennan, LLP

(57) ABSTRACT

The invention relates to a light-emitting component, in particular an organic luminescent diode, having an electrode and a counter electrode and an organic region arranged between the electrode and the counter electrode and having an organic light-emitting region. Furthermore, the invention relates to methods for the production of such a component.

12 Claims, 22 Drawing Sheets

(56) References Cited

OTHER PUBLICATIONS

Figure 1:
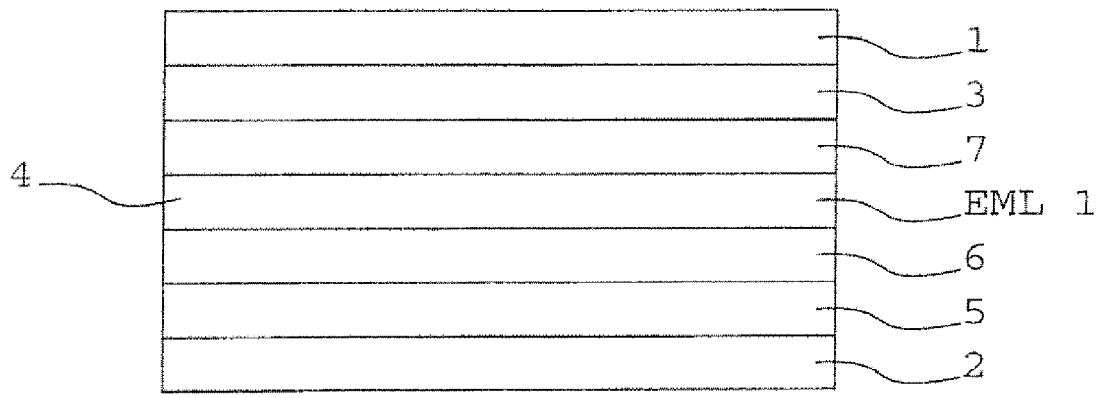

Gufeng, He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Huang, Jingsong et al., "Effect of well number on organic multiple-quantum-well electroluminescent device characteristics," Applied Physics Letters, (1998), vol. 73:23, pp. 3348-3350.

Tang, C.W. et al., "Organic electroluminescent diodes," Applied Physics Letters, vol. 51, No. 12, Sep. 21, 1987, pp. 913-915.

D'Andrade, B.W., et al. "White organic light-emitting devices for solid-state lighting," Adv. Mater. 2004, 16, No. 18, p. 1585.

Baldo, M.A. et al. "Excitonic singlet-triplet ratio in a semiconducting organic thin film," Physical Review B, vol. 60, No. 20, p. 14422, (1999).

Cheng, Gang et al. "Effect of multiple-quantum-well structure on efficiency of organic electrophosphorescent light-emitting devices," Jpn. J. Appl. Phys. vol. 42 (2003) pp. L376-L378.

Dexter, D. L. "A theory of sensitized luminescence in solids," The Journal of Chemical Physics, vol. 21, No. 5, May 1953, p. 836.

Goushi, K. et al. "Triplet exciton confinement and unconfinement by adjacent hole-transport layers," Journal of Applied Physics, vol. 95, No. 12, Jun. 15, 2004, pp. 7798.

Huang, Q. et al. "Quantum efficiency enhancement in top-emitting organic light-emitting diodes as a result of enhanced intrinsic quantum yield," Applied Physics Letters, 89, 263512 (2006).

Kawamura, Y. et al. "Simple accurate system for measuring absolute photoluminescence quantum efficiency in organic solid-state thin films," Japanese Journal of Applied Physics, vol. 43, No. 11A, 2004, pp. 7729-7730.

Kawamura, Y. et al. "Intermolecular interaction and a concentration-quanching mechanism of phosphorescent Ir(III) complexes in a solid film," Physical Review Letters, 96, 017404 (2006).

Reineke, S. et al. "Triplet-exciton quenching in organic phosphorescent light-emitting diodes with Ir-based emitters," Physical Review B, 75, 125328 (2007).

Staroske, W. et al. "Single-step triplet-triplet annihilations: an intrinsic limit for the high brightness efficiency of phosphorescent organic light emitting diodes," Physical Review Letters, 98, 197402 (2007).

Tsuboi, T. "Electronic states of phosphorescent molecules Ir(ppy)3 and PtOEP used in organic light emitting diodes," Journal of Luminescence 119-120 (2006) 288-292.

Xie, Z. et al. "Transient electroluminescence of organic quantum-well light-emitting diodes," Applied Physics Letters, vol. 80, No. 8, p. 1477, (2002).

\* cited by examiner

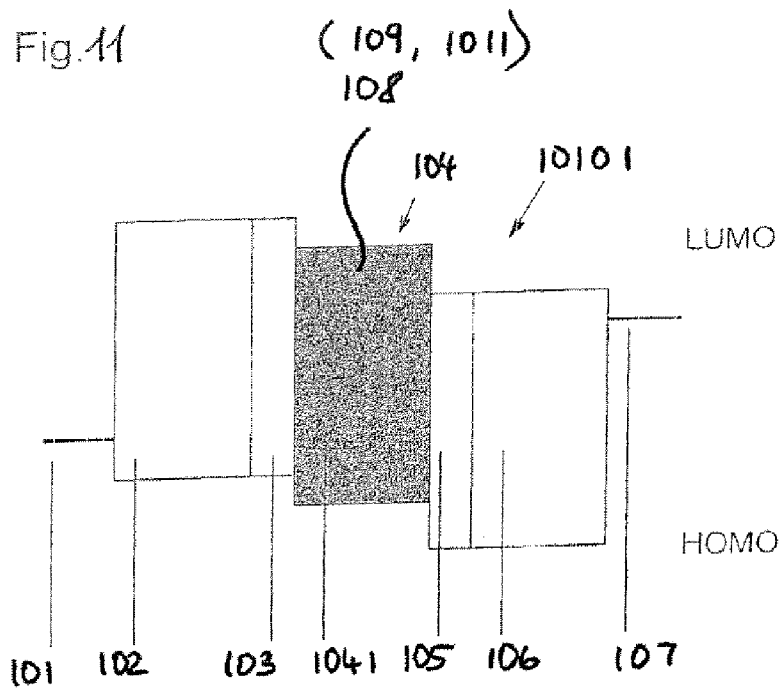
Fig. 11
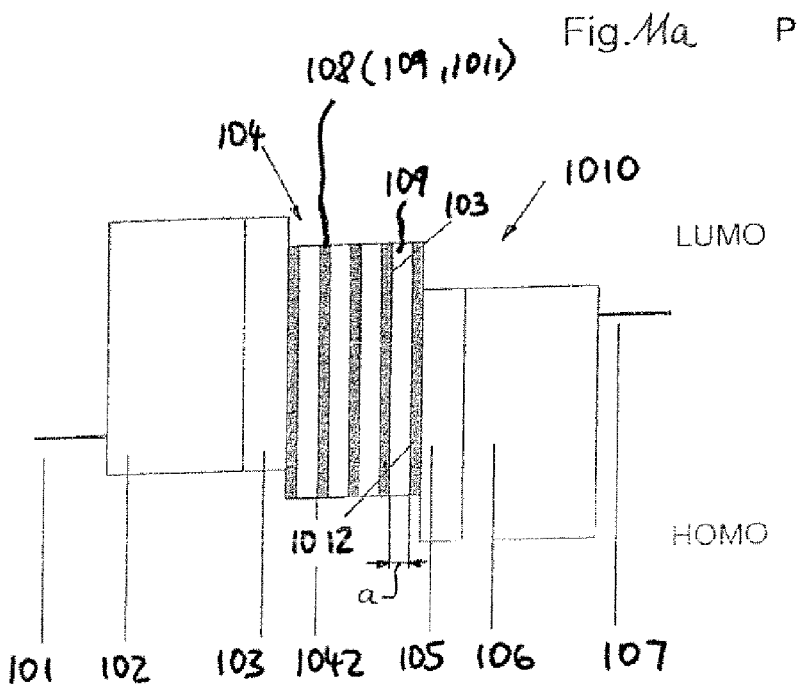
Fig. 11a  Prior art
Fig. 11b

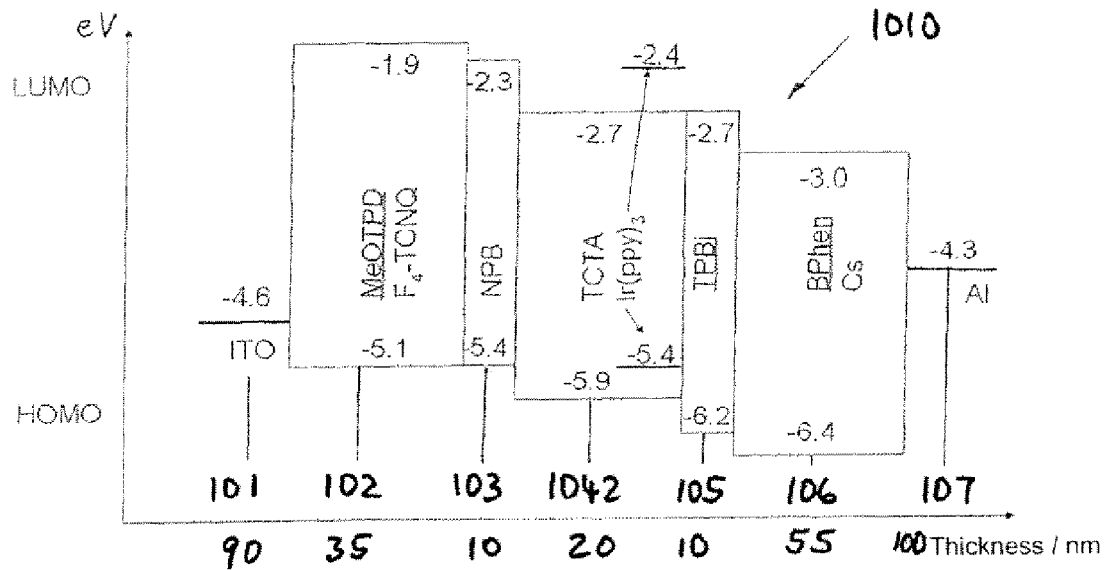
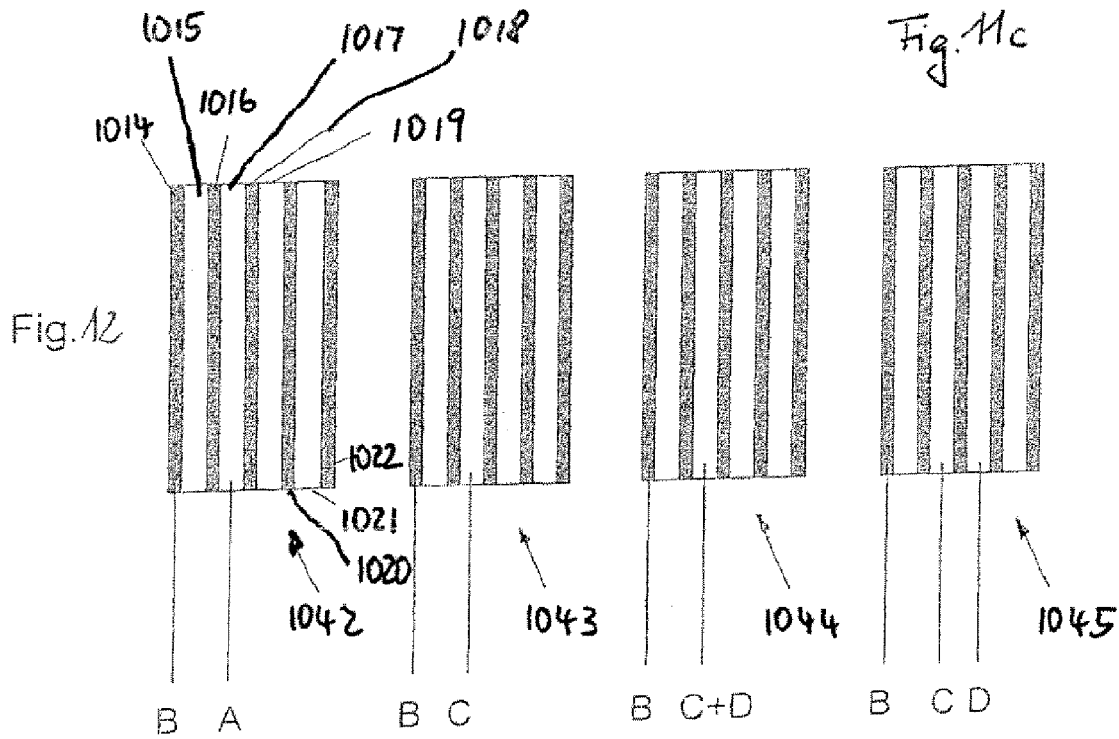
Fig. 12a  Fig. 12b  Fig. 12c  Fig. 12d

Fig. 21
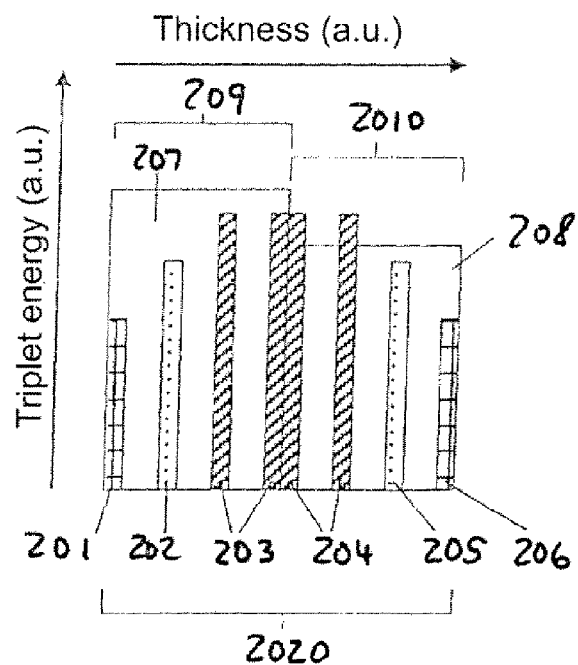
Fig. 21a
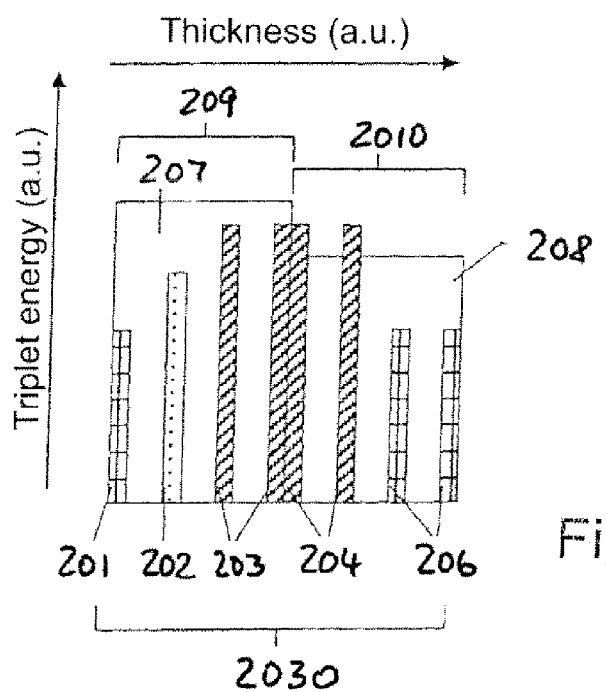
Fig. 21b

LIGHT-EMITTING COMPONENT AND METHOD FOR THE PRODUCTION THEREOF

CROSS-REFERENCE TO RELATED APPLICATIONS

This is a submission pursuant to 35 U.S.C. 154(d)(4) to enter the national stage under 35 U.S.C. 371 for PCT/DE2008/000732 filed Apr. 30, 2008. Priority is claimed under 35 U.S.C. 119(a) and 35 U.S.C, 365(b) to German Patent Application Numbers 10 2007 020644.7 filed Apr. 30, 2007, 10 2007 033209.4 filed Jul. 11, 2007, and 10 2007 061755.2 filed Dec. 14, 2007. The subject matters of PCT/DE2008/000732 and German Patent Application Numbers 10 2007 020644.7, 10 2007 033209.4 and 10 2007 061755.2 are hereby expressly incorporated herein by reference in their entirety.

The invention relates to technologies in the field of organic light-emitting components, in particular organic luminescent diodes.

BACKGROUND OF THE INVENTION

Organic luminescent diodes or organic light-emitting diodes (OLEDs) are by now generally seen as having the potential to offer an alternative to conventional lighting means such as incandescent lamps or fluorescent lamps within the field of lighting technology. By now, the achieved performance efficiencies (cf. for example D'Andrade et al., Adv. Mater. 16 (2004) 1585) are markedly higher than those of incandescent lamps. Current reports support the conclusion that the efficiencies of fluorescent lamps can also be surpassed. To achieve highest performance efficiencies, phosphorescent emitters are currently used as they are designed in such a way that they can convert 100% of the charge carriers employed into light, i.e. achieve a quantum efficiency of 100%.

Besides the performance efficiency, the service life is another important criterion for the everyday use as a lighting means. It is already pointed out in the document EP 1 705 727 A1 that a certain proportion of blue or blue-green light always also has to be present to generate white light. However, the concept of phosphorescent emitters reaches its limits in this spectral region as far as it concerns the stability of the emitter molecules or even more of the matrix material, as the excitation energies approach the binding energies of the molecular components. Thus, the approach was chosen to some extent to cover the blue to blue-green spectral region with a fluorescent emitter and to cover the range comprising longer waves with phosphorescent emitters.

In the document EP 1 705 727 A1, a concept is described how, regardless of the quantum efficiency of direct light emission of a fluorescent blue emitter intrinsically restricted to 25%, the overall efficiency of a white-light OLED can be brought to 100% by using a fluorescent blue emitter with a triplet energy higher than the triplet energy of at least one phosphorescent emitter employed. By diffusion of the per se non-emitting triplet excitons by the blue-emitting layer to a further emission layer which contains the phosphorescent emitter and subsequent exothermic energy transfer, the triplet excitons of the blue emitter may also be used for the light emission.

An OLED with this concept can in fact in principle achieve a quantum efficiency of 100%; however, an experimental implementation shows that the quantum efficiency is greatly reduced, in particular at high light densities, due to the high exciton and charge carrier concentrations required for this. The long life span of the non-emitting triplet excitons in the blue-emitting layer is necessary, on the one hand, such that the excitons may diffuse up to the adjacent layer which contains the phosphorescent emitter. On the other hand, it leads to a high accumulation of the excitons in their main formation zone. This leads to an intensified non-emitting extinction of excitons as, with an increasing exciton density, an exciton may revert more easily to the basic state by losing its energy during another excitation of another exciton (exciton-exciton annihilation). The quantum efficiency thus decreases with an increasing current density which is generally known as a "roll-off" of the efficiency.

Conventional electrically undoped organic light-emitting diodes (OLEDs) which are also referred to as organic luminescent diodes may have a reduced number of layers depending on the design. Here, for example, functions of a hole transport layer and an electron and exciton blocking layer or a hole and exciton blocking layer and an electron transport layer may each be combined in an emission layer structure.

The production of the individual organic layers can be performed by means of thermal evaporation, molecular beam epitaxy, spin-on deposition from solutions and chemical vapour deposition. Customary methods, such as the evaporation of organic materials, only allow for the structuring in one dimension. The standard emission layer structure may consist of a mixed evaporation of a host or matrix material and the phosphorescent emitter dye, usually with concentrations between 1% by mole and 20% by mole.

A light-emitting component having organic layers and an emission of triplet excitons states with increased efficiency is described in the document DE 102 24 021 B4 in which the component consists of a layer order with a hole-injecting contact—the anode—, one or more hole-injecting and hole-transporting layers, a system of stacked layers in the light emission zone, one or more electron-injecting and electron-transporting layers and an electron-injecting contact—a cathode—, the light emission zone consisting of a series of hetero transitions which form boundary surfaces between the stacked layers, alternately a layer made of a material having hole-transporting or bipolar transport properties and a layer made of another material having electron-transporting or bipolar transport properties being arranged in the system of stacked layers and at least one of the materials being mixed with a triplet emitter dopant.

One problem is that an increase of the outer quantum efficiency can in fact be achieved with the stacking sequences of different mixed systems, however, no reduced decrease of the efficiency can be observed at high light densities in these structures. Additionally, the stacking sequences of the mixed systems lead to an increased recombination efficiency by capturing charge carriers on the boundary surfaces of the hetero transitions.

Phosphorescent light-emitting components are known, in particular also implemented as OLEDs. In known components, the outer quantum efficiency decreases markedly at high light intensities. The main cause of the loss in efficiency is the nature of phosphorescent emitter molecules which, in contrary to conventional fluorescent dyes, emit from the electronic triplet state. The actual quantum-mechanically prohibited transition with total spin one is accessible through the use of heavy metals, such as platinum or iridium, as the central atom for the light emission. The excited states, referred to as excitons, have a moderate life span which even for modern phosphorescent emitter molecules is longer by orders of magnitude than that of fluorescent dyes. For this reason, the triplet excitons are markedly more susceptible to any imaginable annihilation mechanism leading to the extinction of such an excited state, without the state being able to contribute to the emission. Therefore, the quantum efficiency decreases markedly at high excitation densities and light intensities, respectively.

The biggest developmental leap in the field of organic luminescent diodes in a thin-film OLED is described by Tang et al., Appl, Phys. Lett. 51 (1987) 913, in which the introduction of phosphorescent molecules as emitter molecules was provided (cf. Baldo et al., Nature 395 (1998) 151). They have the decisive advantage to allow for an internal conversion efficiency of 100%. By using heavy metals, such as platinum or iridium, as the central atom in these molecules, the electronic structure is influenced heavily which in this case results in that both the emission from the triplet state and the intermolecular transfer rate from singlet to triplet state (ISC—"intersystem crossing") are enabled and can be highly efficient (cf. Tsuboi, Journ. Lumin. 119-120 (2006) 288).

In organic luminescent diodes, the charge carriers, namely electrons and holes, are injected statistically with regard to their spin such that this results in the excited states referred to as excitons are also formed with a statistical spin distribution. Due to the spin multiplicity from one to three in the case of the singlet and triplet states, on average only approx. 25% of the excitons are formed in the singlet state (cf. Baldo et al., Phys. Rev. B 60 (1999) 14422). This is in conventional fluorescent OLEDs the limit for the internal conversion efficiency, i.e. 25%. In phosphorescent molecules, both of the excitation states, singlet and triplet, are diverted to the triplet state (ISC) or fowled such that the molecules are potential materials for an internal quantum efficiency of 100% in OLEDs. One disadvantage of the molecules is the long life span of the excited state in comparison to fluorescent dyes. Even in the case of state-of-the-art phosphorescent molecules, the life span is longer by a few orders of magnitude, in the range of a few microseconds, cf. in this connection the emission from the singlet state with life spans of a few nanoseconds (Kawamura et al., J. Journ. Appl. Phys. 43 (2004) 7729).

In contrast to most fluorescent OLEDs, the emission zone of which representing a pure layer of the fluorescent dye, phosphorescent dyes are mixed into a host material in a diluted form to avoid a so-called aggregate extinction (cf. Kawamura et al., Phys. Rev. Lett. 96 (2006) 017404).

In this connection, it is important that the host material has a higher triplet energy than or at least a triplet energy as high as that of the emitter dye to exclude the energy transfer of the emitter triplet excitons to the excitons of the host molecules as a possible loss channel. Furthermore, the emission layers require relatively high concentrations of the emitter dye (~5-10% by mole) as the energy transfer from the host material to the emitter molecule is slower and of a shorter range. The energy transfer is a Dexter process (cf. Dexter, Journ. Chem. Phys. 21 (1953) 836). This in turn is detrimental to the absolute efficiency as it can already come to the above-mentioned aggregate extinction with these concentrations. With this concentration, the direct exciton diffusion to the emitter molecules is possible without any problems.

Organic components having a mixed system of host material and phosphorescent emitter dye further contain blocker or blocking layers adjacent to the emission zone as the mean diffusion length of the excitons also increases with the long life span which should limit both charge carriers and triplet excitons to the emission zone. To achieve the latter, the layers need to have a significantly higher triplet energy than the emitter dye (Tblocker>>Temitter/~0.4 eV) (cf. Goushi et al., Journ. Appl. Phys. 95 (2004) 7798).

The long life span renders the excited triplet states very susceptible to all the annihilation mechanisms, in particular at high excitation densities, the annihilation mechanisms being triplet-triplet annihilation (TTA), triplet-charge carrier annihilation and field-induced dissociation of the excitons in free charge carriers (cf. Reineke et al., Phys. Rev. B 75 (2007) 125328). In this connection, the triplet-triplet annihilation is the dominant process. En principle, the process may take place by means of two different mechanisms: (a) by diffusion of the triplet excitons until two excited states are close enough to another to annihilate, and (b) by long-range interaction, based on the energy transfer model according to Förster.

If two excited states are that close that the electronic orbitals overlap and interact, the annihilation step may also take place by means of the so-called energy transfer according to Dexter. In the latter, the annihilation is performed in one step. The process is only dictated by the so-called Förster radius of the emitting molecule which defines the maximum distance of two excited states in which an annihilation still takes place (cf. Staroske et al., Phys. Rev. Lett. 98 (2007) 197402). The latter process is, in contrast to the diffusion-based mechanism, not dependent on the concentration of the emitter molecules, the Förster-based mechanism being an intrinsic boundary for the triplet-triplet annihilation TTA in the OLEDs as it is only dictated by the optical properties of the used materials. In other words, the diffusion-based annihilation mechanism is always intrinsically accompanied by the Förster-based annihilation.

To minimize the loss in efficiency in phosphorescent OLEDs, the approaches outlined below were chosen.

It was attempted to minimize the intrinsic life span of the excited triplet state on the emitter molecule. Here, it seems that the development is exploited; modern emitters have triplet life spans of a microsecond and less. The heavy metal influences the properties in a very significantly and its current optimum is found with iridium (cf. Baldo et al., Nature 395 (1998) 151; Baldo et al., Phys. Rev. B 62 (2000) 10967).

Furthermore, it was suggested to minimize the life span of the excited state by means of the optical properties defining the surroundings. By introducing a higher-quality OLED microcavity, the life span can be reduced by up to 50%, as described in Huang et al., Appl. Phys. Lett. 89 (2006) 263512.

Finally, it was proposed to minimize the exciton density which is required for a certain light intensity by means of widening the recombination zone in the emission zone. This can be achieved by means of the approach of a double emission layer, for example (He, Appl. Phys. Lett. 85 (2004) 3911).

In the case of organic light-emitting components, there are several examinations of the so-called emission layer, thus the region of the light generation, in which the emission zone is made up by quantum well structures, most of the times, however, by using fluorescent dyes. In this connection, there are efficiency improvements which are to some extent drastic, the main reason for which is that the recombination efficiency is increased, for example by improved capturing of charge carriers (Huang, Appl. Phys. Lett. 73 (1998) 3348; Xie, Appl. Phys. Lett. 80 (2002) 1477). As the loss in efficiency in fluorescent OLEDs due to the short life span of the singlet state is only marginally determined by bimolecular processes, no improvements with regard to the loss in efficiency are achieved by means of these structures.

Phosphorescent OLEDs, the emission zone of which having a quantum well structure, are described in Cheng et al., Jpn. J. Appl. Phys. 42 (2003) L376. Here, the known triplet emitter 2,3,7,8,12,13,17,18-octaethyl-21H,23H-porphine platinum(II) (PtOEP) is used. Compared with a standard structure, an increase of the external quantum efficiency by a factor of about two is described for the quantum well structure. The quantum well structure has a stronger loss in quantum efficiency at higher light intensities such that the given structures ultimately have almost identical efficiency values at current densities of about 200 mA/cm2. The effect is explained by the saturation of the emitter molecules.

The spatial separation of different regions of mixed systems of host material and emitter dye has another advantage. The separation decouples largely any energy transfer, also and in particular at low excitation densities, between the centres. Typical phosphorescent emitters have Förster radii of less than 2 nm such that the Förster-based energy transfer between adjacent molecules can be prevented by distances in this order of magnitude (Kawamura et al., Phys. Rev. Lett. 96 (2006) 017404).

Emission layer structures in which all the emitter dyes are introduced into a host or matrix material in different concentrations were described (D'Andrade, Adv. Mat. 16 (2004) 624). The presented emission layer structure achieves about 16 μm/W at 100 cd/m2 and 11.1 μm/W at 1000 cd/m2. This corresponds to a reduction of the efficiency to 69% of the value at 100 cd/m2.

SUMMARY OF THE INVENTION

The invention has the object to provide an improved light-emitting component with high efficiency even at high light densities as well as a method for the production thereof.

According to the invention, this object is solved by a light-emitting component, in particular an organic luminescent diode, having an electrode and a counter electrode and an organic region arranged between the electrode and the counter electrode and having an organic light-emitting region, the region comprising at least one emission layer (EML 1) and being formed such that it emits light in several colour ranges within the visible spectral region, optionally up to white light, when applying an electrical voltage to the electrode and the counter electrode, wherein the emission layer (EML 1) contains at least one fluorescent emitter emitting light predominantly within the blue or blue-green spectral region and at least one phosphorescent emitter emitting light predominantly within the non-blue spectral region, a triplet energy for an energy level of a triplet state in the emission layer (EML 1) for at least one fluorescent emitter is higher than or approximately equal to (within 0.1 eV) a triplet energy for an energy level of a triplet state of the at least one phosphorescent emitter, and the light-emitting organic region is formed such that it emits a proportion of at least 5% of the generated light within the visible spectral region as fluorescent light of singlet states of the at least one fluorescent emitter in the emission layer (EML 1). Furthermore, an organic light-emitting component, in particular a phosphorescent organic luminescent diode, with an anode and a cathode as well as an array of organic layers therebetween which comprises a hole transport layer, an emission layer and an electron transport layer, the emission layer presenting a substructuring with zones, these zones comprising zones consisting of at least one host material and zones consisting of a mixed system with at least one phosphorescent emitter dye, the zones consisting of the mixed system being spatially separated from another by the zones consisting of the at least one host material and a method for the production thereof in which an anode and a cathode as well as an array of organic layers therebetween are formed, the latter comprising a hole transport layer, an emission layer and an electron transport layer, the emission layer presenting a substructuring with zones, these zones comprising zones consisting of at least one host material and zones consisting of a mixed system of at least one phosphorescent emitter dye and the at least one host material, the zones consisting of the mixed system being formed such that they are spatially separated from another by the zones consisting of the at least one host material, are provided.

According to one aspect, the invention encompasses the idea of a light-emitting component, in particular an organic luminescent diode, having an electrode and a counter electrode and an organic region arranged between the electrode and the counter electrode and having an organic light-emitting region, the region comprising at least one emission layer and being formed such that it emits light in several colour ranges within the visible spectral region, optionally up to white light, when applying an electrical voltage to the electrode and the counter electrode, the emission layer containing at least one fluorescent emitter emitting light predominantly within the blue or blue-green spectral region, and at least one phosphorescent emitter emitting light predominantly within the non-blue spectral region, a triplet energy for an energy level of a triplet state in the emission layer for the at least one fluorescent emitter being higher than or approximately equal to (within 0.1 eV) a triplet energy for an energy level of a triplet state of the at least one phosphorescent emitter and the light-emitting organic region being formed such that it emits a proportion of the generated light of at least 5% within the visible spectral region as fluorescent light of singlet states of the at least one fluorescent emitter in the emission layer.

Surprisingly, it was found that a light-emitting organic component in accordance with this design shows a very small decrease of the quantum efficiency with increasing current. Compared with the prior art, in particular compared with the document EP 1 705 727 A1, the invention has thus the advantage that a light-emitting component having high efficiency and at the same time a long life span, even at high light densities as they are required, for example, in lighting technology, for a light emission in several colour ranges within the visible spectral region up to white light is provided. The observed small decrease of the quantum efficiency can be explained as follows: The problem that a large accumulation of triplet excitons forms in the fluorescent emission layer at the high current densities required for high light densities which leads to the so-called "roll-off" of the efficiency is solved by the direct admixture of one or more phosphorescent emitters as the triplet excitons formed on the one or all of the fluorescent emitters are thus directly transferred to the phosphorescent emitter(s) and the accumulation cannot form at all in the first place.

Another important advantage of the invention is the easier production of the component as, thanks to the mixing of the emitters, fewer layers are to be applied.

It shows that further optimisation is possible through the thorough implementation of the organic light-emitting component. Too high a concentration of the phosphorescent emitter in the emission layer also promotes the transfer of the singlet excitons from the fluorescent emitter. From a certain extent onwards, this is an undesired effect as because of this fluorescent light can no longer form from the singlet excitons. Experiments have shown that a concentration of the phosphorescent emitter of about 0.25 percent by weight in the fluorescent emitter in the emission layer of the component leads to a balanced emission of fluorescent and phosphorescent light. This is a concentration that is also very manageable from a technical point of view (see, for example, Shao et al., Appl. Phys. Lett. 86, 073510 (2005)). The concentration of the phosphorescent emitter actually to be set may of course also be chosen higher or lower, depending on the used emitters and the desired colour appearance of the emitted light.

The proportion of fluorescent light is set via the concentration ratio of fluorescent and phosphorescent material in the emission layer. The more fluorescent emitter it contains, the higher is the proportion of the fluorescent light in the total light emission. The fluorescent light can then be measured experimentally by recording an electroluminescence spectrum and determining the intensity proportion of the emitter fluorescing within the blue spectral region.

A preferred further development of the invention provides for the emission layer consisting of a compact layer of the at least one fluorescent emitter used as the matrix material, the at least one phosphorescent emitter being incorporated in the compact layer. In this design, the invention sets itself apart, in particularly also from the prior art for multi-coloured emitting polymer OLEDs in which the emission layer generally consists of a polymer having good charge-carrier conduction properties to which several types of emitter molecules are admixed (see, for example, Shih et al., Appl. Phys. Lett. 88, 251110 (2006)), as here no matrix exclusively responsible for the charge carrier transport is used, but his function is assumed by the fluorescent emitter.

In a purposeful implementation of the invention, it can be provided for the emission layer to consist of an organic material into which the at least one fluorescent emitter having a concentration between 0.1 and 50% by mole and the at least one phosphorescent emitter are incorporated.

An advantageous embodiment of the invention provides for the organic light-emitting region being formed such that it emits a proportion of at least 10% of the generated light within the visible spectral region as fluorescent light of singlet states of the at least one fluorescent emitter in the emission layer.

A further development of the invention preferably provides for the organic light-emitting region being formed such that it emits a proportion of at least 15% of the generated light within the visible spectral region as fluorescent light of singlet states of the at least one fluorescent emitter in the emission layer.

In an advantageous embodiment of the invention, it can be provided for the organic light-emitting region being formed such that it emits a proportion of at least 20% of the generated light within the visible spectral region as fluorescent light of singlet states of the at least one fluorescent emitter in the emission layer.

A further development of the invention can provide for the organic light-emitting region being formed such that it emits a proportion of at least 25% of the generated light within the visible spectral region as fluorescent light of singlet states of the at least one fluorescent emitter in the emission layer. In connection with white-light spectra, the rule applies that the lower a proportion within the blue spectral region is, thus the fluorescent-light proportion in the components described herein, the lower is the colour temperature of the electroluminescence spectrum. However, the invention only makes high quantum efficiencies (close to 100% internally) in this case when using highly efficient emitters with luminescence efficiencies of close to 100%. That is to say, an electroluminescence spectrum with a proportion of 25% of fluorescent light within the blue spectral region corresponds to the spectrum with the highest colour temperature and at the same time the highest possible quantum efficiency when using highly efficient emitters with luminescence efficiencies of close to 100%. If the fluorescence proportion is more than 25%, the colour temperature becomes higher, but the quantum efficiency drops.

A preferred further development of the invention provides for the organic light-emitting region comprising a further emission layer with at least one phosphorescent emitter emitting light predominantly within the non-blue spectral region.

In a purposeful implementation of the invention, it can be provided for the emission layer and the further emission layer being formed adjacent to one another.

An advantageous embodiment of the invention provides for the emission layer and the further emission layer being formed such that they transport holes and that a distance between a surface of the emission layer facing the electrode implemented as the cathode and a surface of the cathode facing the emission layer being smaller than a distance between a surface of the further emission layer facing the cathode and a surface of the cathode facing the further emission layer.

A further development of the invention preferably provides for the emission layer and the further emission layer being formed such that they transport holes and that a distance between a surface of the emission layer facing the counter electrode implemented as the anode and a surface of the anode facing the emission layer being smaller than a distance between a surface of the further emission layer facing the anode and a surface of the anode facing the further emission layer.

In an advantageous implementation of the invention, it can be provided for the emission layer being formed such that it transports electrons and the further emission layer being formed such that it transports holes and that a distance between a surface of the emission layer facing the electrode implemented as the cathode and a surface of the cathode facing the emission layer being smaller than a distance between a surface of the further emission layer facing the cathode and a surface of the cathode facing the further emission layer.

A further development of the invention can provide for the emission layer being formed such that it transports holes and the further emission layer being formed such that it transports electrons and that a distance between a surface of the emission layer facing the counter electrode implemented as the anode and a surface of the anode facing the emission layer being smaller than a distance between a surface of the further emission layer facing the anode and a surface of the anode facing the further emission layer.

A preferred further development of the invention provides for a hole blocking layer being arranged between the emission layer and the cathode, the hole blocking layer transporting electrons and an organic material of the hole blocking layer having a HOMO level which is by at least about 0.3 eV lower than a HOMO level of the fluorescent emitter in the emission layer. It has been found that an energy barrier of less than 0.3 eV is not sufficient to block holes really efficiently.

In a purposeful implementation of the invention, it can be provided for an electron blocking layer being arranged between the emission layer and the anode, the electron blocking layer transporting holes and an organic material of the electron blocking layer having a LUMO level which is by at least about 0.3 eV higher than a LUMO level of the fluorescent emitter in the emission layer. It has been found that an energy barrier of less than 0.3 eV is typically not sufficient to block electrons really efficiently.

An advantageous embodiment of the invention provides for a minimum energy of singlet excitons and triplet excitons in the hole blocking layer or in the electron blocking layer being higher than a minimum energy of singlet excitons and triplet excitons in the emission layer.

A further development of the invention preferably provides for the emission layer and/or the further emission layer being formed in several layers.

In an advantageous implementation of the invention, it can be provided for the emission layer having a thickness between about 10 nm and about 100 nm. Layers having a thickness of at least 10 nm are still manageable in terms of the production technology. Layers having a thickness of more than 100 nm lead to voltage drop that is too high.

A further development of the invention can provide for the organic light-emitting region being formed such that it emits white light, the at least one phosphorescent emitter in the emission layer and/or in the further emission layer being an emitter emitting light within the red, the orange, the yellow or the green spectral region.

A preferred further development of the invention provides for a respective doped organic layer being formed between the organic light-emitting region and the electrode and/or between the organic light-emitting region and the counter electrode.

In a purposeful implementation of the invention, it can be provided for the respective doped organic layer being a layer p-doped with an acceptor material or n-doped with a donor material.

An advantageous embodiment of the invention provides for the at least one fluorescent emitter in the emission layer being an organo-metallic compound or a complex compound with a metal having an atomic number of less than 40. Through this, it is ensured that no strong spin-orbit coupling is present for the material.

A further development of the invention preferably provides for the at least one fluorescent emitter in the emission layer comprising an electron-attracting substituent from one of the following classes: halogens such as fluorine, chlorine, bromine or iodine; halogenated or cyano-substituted alkanes or alkenes, in particular trifluoromethyl, pentafluoroethyl, cyanovinyl, dicyanovinyl, tricyanovinyl; halogenated or cyano-substituted aryl radicals, in particular pentafluoroethyl; and boryl radicals, in particular dialkylboryl, dialkylboryl with substituents at the aryl groups, diarylboryl or diarylboryl with substituents at the aryl groups.

In an advantageous implementation of the invention, it can be provided for the at least one fluorescent emitter in the emission layer comprising an electron-repelling substituent of one of the following classes: alkyl radicals such as methyl, ethyl, tertiary butyl, isopropyl; alkoxy radicals; aryl radicals with or without substituents at the aryl, in particular tolyl and mesityl; and amino groups, in particular NH2, dialkylamine, diarylamine and diarylamine with substituents at the aryl.

A further development of the invention can provide for the fluorescent, at least one emitter in the emission layer comprising a functional group with an electron-acceptor property from one of the following classes: oxadiazole, triazole, benzothiadiazoles, benzimidazoles and N-arylbenzimidazoles, bipyridine, cyanovinyl, chinolines, triarylboryl, silol units, in particular derivative groups of silaeyclopentadiene, cyclooctatetraene, chinoid structures and ketones, including chinoid thiophene derivatives, pyrazolines, pentaarylcyclopentadiene, benzothiadiazoles, oligo-para-phenyl with electron-attracting substituents and fluorine and spiro bifluorene with electron-attracting substituents.

A preferred further development of the invention provides for the fluorescent, at least one emitter in the emission layer comprising a functional group with an electron-donor property from one of the following classes: triarylamines, oligo-para-phenyl or oligo-meta-phenyl, carbazoles, fluorine or spiro bifluorenes, phenylene-vinylene units, naphthalene, anthrazene, perylene, pyrene and thiophene.

In a purposeful implementation of the invention, it can be provided for the following features being formed: the electrode is formed as an optically reflecting electrode, a charge-carrier transport layer is arranged between the emission zone and the optically reflecting electrode, the layer having a layer thickness d1 and $d1=(\lambda blue/4)-PD$ applying for the layer thickness, PD being the penetration depth of electromagnetic waves into the optically reflecting electrode and $\lambda blue$ being a wavelength in the blue spectral region of 380 nm to 500 nm.

The description of an actual penetration depth PD is carried out by means of the phase displacement $\Phi cathode$ of the light during the reflection. This displacement depends on the cathode material (metal) and the wavelength and is calculated from the optical constants of the adjacent materials (see, for example, Dodabalapur et al., journal of Applied Physics, 80, 6954 (1996)): $z=\lambda/4-|(\Phi cathode*\lambda/4\pi)|$ with $\Phi cathode=\arctan(2no km/(no^2-nm^2-km^2))$. no is the real part and ko the imaginary part of the complex refractive index of the organic layers, nm is the real part and km the imaginary part of the complex refractive index of the material out of which the cathode is formed.

An advantageous embodiment of the invention provides for the organic region being formed with a layer thickness dOB for which the following applies: $dOB=dOB+dOB2-danode$ in which $dOB1=(2*n+1)*0.25*\square blue$ and $dOB2=m*0.5*\square blue$ and dOB1 being a distance of the emission layer from a cathode, n being an integer n higher than or equal to zero, dOB2 being a distance of the emission layer from a boundary surface between an anode and a carrier substrate, m being a natural number higher than or equal to 1 and danode being a layer thickness of the anode. Glass is preferably used as the carrier substrate.

A further development of the invention preferably provides for a spatial area with a first concentration of the at least one phosphorescent emitter and one further spatial area with a second concentration of the at least one phosphorescent emitter being formed in the emission layer, the second concentration differing from the first concentration.

In an advantageous implementation of the invention, it can be provided for a spatial area being formed in the emission layer, the spatial area being free from any admixture of the at least one phosphorescent emitter.

Furthermore, according to the invention, an organic light-emitting component, in particular a phosphorescent organic luminescent diode, is provided with an anode and a cathode as well as an array of organic layers therebetween which comprises a hole transport layer, an emission layer and an electron transport layer, the emission layer presenting a substructuring with zones, these zones comprising zones consisting of at least one host material and zones consisting of a mixed system with at least one phosphorescent emitter dye, the zones consisting of the mixed system being spatially separated from another by the zones consisting of the at least one host material. Such a component can also be referred to as a phosphorescent organic component.

The triplet energies (Thost) of the at least one host material are preferably higher than the triplet energy (Temitter) of the at least one phosphorescent emitter dye (Thost>Temitter).

The mixed system may be formed by means of the at least one host material or by using one or more host materials differing from the former. Additionally, at least one further host material can be admixed to the at least one host material. In contrast to the mixed system which contains one or more phosphorescent emitter dyes, the zones consisting of the at least one host material are free from emitter dyes and consist of one or more host materials. Host material ("matrix material") is generally the material that is used to transfer excitons from it to the emitter dye, virtually a donor material.

The emission layer may present layer-like zones of the mixed system of host material and emitter dye by means of a predetermined substructuring, the substructuring being formed by a sequential succession of layer-like zones in the form of a vertical structuring of zones of pure host material and mixed-system zones of host material and phosphorescent light-emitting emitter dye.

The emission layer may, on the other hand, present layer-like zones of the mixed system of host material and emitter dye by means of a predetermined substructuring, the substructuring being formed by a sequential succession of layer-like zones in the form of a lateral structuring of zones of pure host material and mixed-system zones of host material and phosphorescent light-emitting emitter dye. The emission layer may also consist in a vertical structuring and a lateral structuring of layer-like zones. Finally, the zones of the mixed systems and/or the host materials may be formed as spherical or cubic bodies or as a body with a given geometry in the emission layer. Both host material and emitter dye of different emission layers may in each case be different.

The hole transport layers may be combined in one layer and/or the electron transport layers may be combined in one layer.

The zones of pure host material can be replaced by zones of another host material, the triplet energy of the latter being higher than the triplet energy of the employed emitter dye. The zones of pure host material can also be replaced by zones of a material combination of several materials, the triplet energies Tcomb of the latter being higher than the triplet energies Temitter of the emitter dye, with Tcomb>Temitter for all the materials. Different zones of pure host material can also be replaced by zones of several materials in any sequential order. Different zones of the mixed system may contain different phosphorescent emitter dyes. The zones of a mixed system may contain several different host materials and/or several different emitter dyes.

The vertical structuring may be performed during a mixed evaporation of host material and emitter dye by means of an arrangement of mechanically displaceable baffles in front of the emitter dye source which interrupt the evaporation of the emitter dye periodically. The lateral structuring can be generated during the mixed evaporation of host material and emitter dye by means of periodically inserting a shadow mask directly in front of the substrate. Such a mask is limited in its resolution due to the production process (for example, diffraction limit during laser cutting) such that centres produced in this way show an expansion within the micrometer range. By quickly displacing the shadow mask in the x-direction and/or y-direction around the normal (z-direction) of the mask itself, actual openings of the mask may be reduced drastically. In this connection, the displacement in both directions is in each case preferably less than the diameter of the openings in the shadow mask. As a combination of vertical structuring and lateral structuring is also possible, a substructuring can be achieved in all the spatial directions.

In phosphorescent organic components, relatively high concentrations of the emitter material have to be introduced into a host material, as described above. This is necessary to efficiently capture the electrically formed excitons on the emitter dye. The high concentration results in it being possible for the excited triplet states of the emitter dye to efficiently diffuse on a lattice of non-excited emitter dyes. The diffusion is a Dexter process, typically with an interaction range of 1-2 nm (Dexter, Journ. Chem. Phys. 21 (1953) 836).

It is essential that the diffusion on the lattice of emitter dyes is effectively prevented. The diffusion is suppressed by the substructure of the emission layer which limits the excitons in their diffusion. The substructures are not required to efficiently capture charges in order to, for example, increase the recombination efficiency and thus the absolute electroluminescence efficiency (Cheng et al., Jpn. J. Appl. Phys. 42 (2003) L376). It is instead attempted to enclose the emitter dyes in zones which are spatially surrounded by a material whose triplet energy—similar to that of the conventional blocker layers—is high in comparison to the triplet energy of the emitter dye. In this connection, the actual concentration of the emitter dyes in these zones is not reduced to allow for an efficient energy transfer of the host excitons to the emitter. It is exploited that the diffusion process is a statistical process without any preferred direction and that furthermore each diffusion step to a neighboured molecule is not influenced by the previous step. By introducing energetic barriers which prevent a diffusion of the excited state in this direction, the actual probability of the diffusion in favour of the radiating recombination of the excitons, i.e. while emitting light, is thus reduced. Neighboured exciton sublayer structures are arranged further from each other than the mean interaction range typical according to Dexter, i.e. at least about 1 to about 2 nm, depicts.

For the implementation of the substructuring, it is only important that the triplet energy of the materials surrounding the zones with emitter dye is higher than the triplet energy of the emitter dye to efficiently retain the triplet excitons of the dye in the zones. At best, this structure can be produced from a combination of pure, conventional host material and a mixed system from host material and emitter dye. The emission layer is structured such that defined separated exciton substructures of the mixed system exist in the surroundings of the pure host material within the emission layer.

A further development of the invention can provide for the zones being formed in a layer structure, the layer structure comprising a sequential succession of layer-like zones in the form of a vertical structuring of the zones consisting of the mixed system and the zones consisting of the at least one host material.

A preferred further development of the invention provides for the zones being formed in a layer structure, the layer structure comprising a sequential succession of layer-like zones in the form of a lateral structuring of the zones consisting of the mixed system and the zones consisting of the at least one host material.

In a purposeful implementation of the invention, it can be provided for at least a part of the zones being formed as spherical or cubic bodies.

An advantageous embodiment of the invention provides for adjacent boundary surfaces of the zones consisting of the mixed system being separated from each other by at least a distance within the nanometer range, the distance corresponding to a thickness of the zones consisting of the at least one host material. The distance is preferably at least two nanometers.

A further development of the invention preferably provides for the hole transport layer being p-doped and/or the electron transport layer being n-doped. An electrical doping is provided for.

In an advantageous implementation of the invention, it can be provided for the zones consisting of the at least one host material being replaced by zones of one other host material, the triplet energy (Thost1) of which being higher than the triplet energy (Temitter) of the at least one phosphorescent emitter dye, with Thost1>Temitter.

A further development of the invention can provide for zones consisting of the at least one host material being replaced by zones of a material combination of several materials, the triplet energies (Tcomb) of the latter being higher than the triplet energies (Temitter) of the at least one phosphorescent emitter dye, with Tcomb>Temitter for all the materials.

A preferred further development of the invention provides for zones consisting of the at least one host material being formed with zones of several materials in any sequential order.

In a purposeful implementation of the invention, it can be provided for different phosphorescent emitter dyes being contained in the mixed systems. The different emitter dyes differ from each other by their respective emission spectra.

An advantageous embodiment of the invention provides for several mixed systems being formed with different host materials. A mixed system is preferably formed from one or more host materials as well as one or more emitter dyes incorporated therein.

A further development of the invention preferably provides for additional emission layers with a fluorescence emission being formed from singlet states. The additional emission layers are formed as regions consisting of one or more fluorescent emitter dyes or as regions consisting of a mixed system with one or more host materials and one or more fluorescent emitter dyes.

In an advantageous implementation of the invention, it can be provided for the concentration of the at least one phosphorescent emitter dye in the at least one host material within the mixed systems being between 0.1% by mole and 50% by mole. 0.1% by mole guarantees an efficient transfer of the excitons from the host or matrix material to the emitter dye and more than 50% by mole markedly reduces the efficiency of the emission by means of aggregation.

A further development of the invention can provide for a distance between the zones consisting of the at least one host material being between about 2 nm and about 20 nm. The individual zones are sufficiently separated when using a distance of about 2 mm such that energy transfer processes of a short range do not prevent the desired localisation effect. A distance of more than about 20 mm leads to high stresses in the component. Furthermore, the transfer from host material to emitter dye becomes inefficient or no longer takes place at all.

A preferred further development of the invention provides for the zones consisting of the mixed system having a spatial expansion of about 0.5 nm to about 100 nm. Less than 0.5 nm leads to a molecular order of magnitude which is hardly practical from a technical point of view.

In a purposeful implementation of the invention, it can be provided for the organic layers consisting of small molecules applied by vapour-deposition under vacuum or partly of polymers.

An advantageous embodiment of the invention provides for the emission layer having one further substructuring in which a combination of different emitter dyes emitting mixed-coloured light up to white light is provided in different zones of a mixed region, the emitter dyes having different basic emission spectra. They are preferably phosphorescent emitter dyes, however, fluorescent emitter dyes may also be provided for.

A further development of the invention preferably provides for the triplet energies Thost of host materials being lower than or equal to the triplet energies Temitter of the emitter dyes.

To generate a matched coloured-light emission up to a white-light emission, an emission layer structure with at least one emission layer with a substructuring is formed. The at least one emission layer comprises a combination of different emitter materials with different basis emission spectra in different zones of a mixed region such that a colour-matched light or white light is emitted. The different layers (zones) with different emitter dyes which in this respect each represent a mixed region may also form an array of several emission layers. The further substructuring of the emission layer overlaps with the zone structuring described before.

Energy transfer processes between different emitter dyes are suppressed for the generation of white light as otherwise the energy is transferred by means of efficient transfer mechanisms to the energetically most favourable state, in particular the red emitter states, before a recombination while emitting photons occurs. Accordingly, both white light by the emission of different zones with different emission spectra and the reduction of the diffusion-based triplet-triplet annihilation can be achieved by means of the proposed component. The combinational possibility to spatially arrange different emitter dyes in the emission layer structure results in a simplified modular variability in the colour matching to obtain light with a given spectrum, in particular white light.

The component with at least one emission layer to generate white light may comprise regions in which the triplet energies Thost of the host material are lower than or equal to the triplet energies Temitter of the emitter dye, with Thost<Temitter or Thost=Temitter. The component for white-light emission with at least one emission layer may contain additional fluorescent emission layers which in turn can be either pure layers of the emitter dye and/or a mixed system of host material and emitter dye. The light decoupling efficiency of the component may be optimised for the blue spectral region, the region with a wavelength between 400 nm and 500 nm, and this optimisation can be performed by means of adjusting the layer thicknesses of the transport layers.

Such components are realised by means of a production method using different emitter dyes with different emission colours in a provided emission layer structure for a matched colour emission or a white-light emission.

Furthermore, a method for the production of an organic component, in particular a phosphorescent organic luminescent diode, is provided in which an anode and a cathode as well as an array of organic layers therebetween are formed, the latter comprising a hole transport layer, an emission layer and an electron transport layer, the emission layer presenting a substructuring with zones, these zones comprising zones consisting of at least one host material and zones consisting of a mixed system of at least one phosphorescent emitter dye and the at least one host material, the zones consisting of the mixed system being formed such that they are spatially separated from another by the zones consisting of the at least one host material. The production method may be extended or adapted accordingly in connection with the advantageous implementations of the component.

DESCRIPTION OF THE EMBODIMENTS OF THE INVENTION

Figure 2:
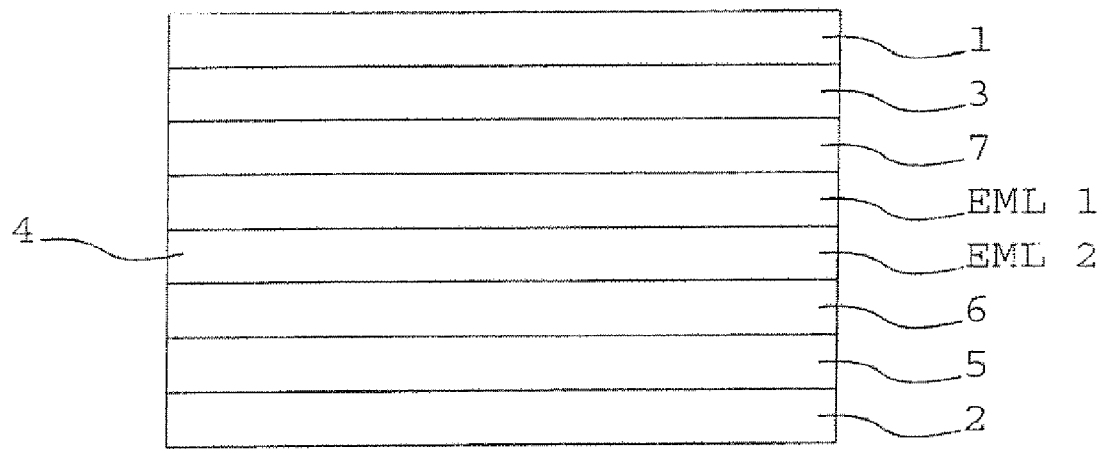
Figure 3:
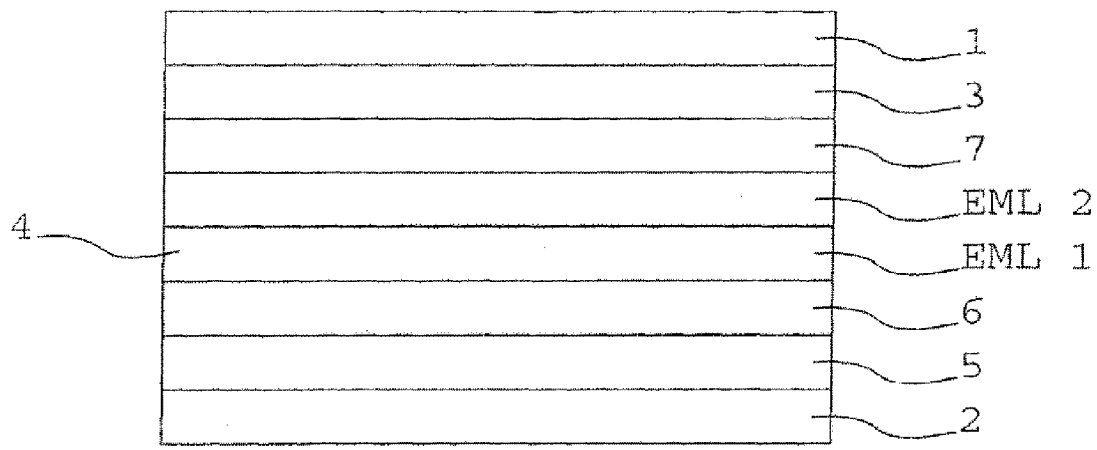
Figure 4:
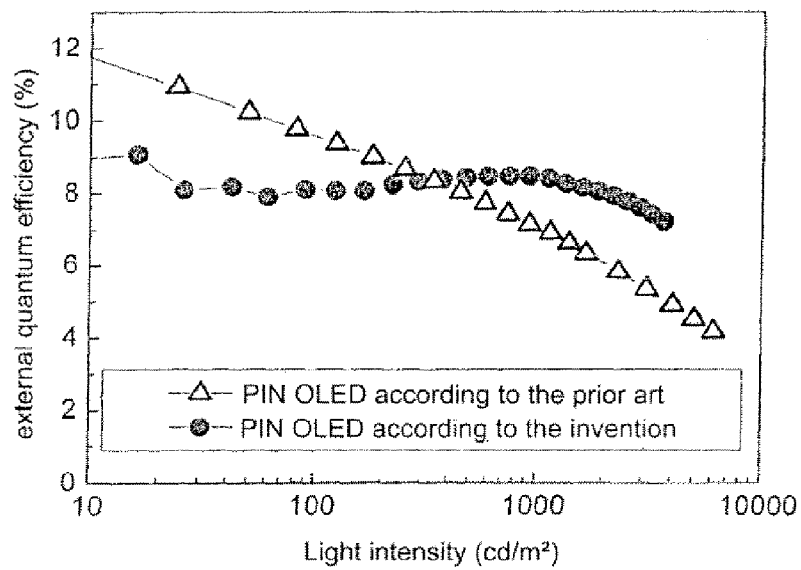
Figure 5:
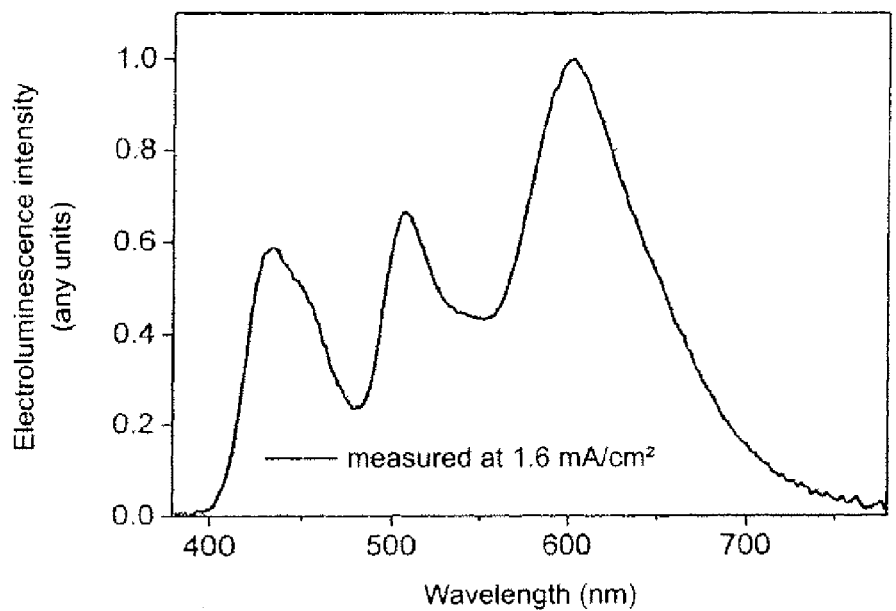
Figure 6:
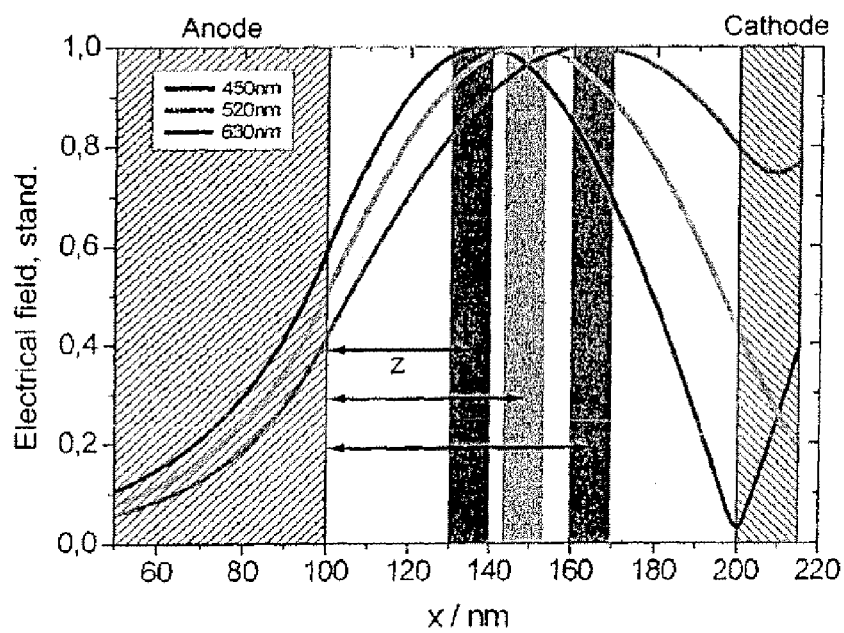
Figure 7:
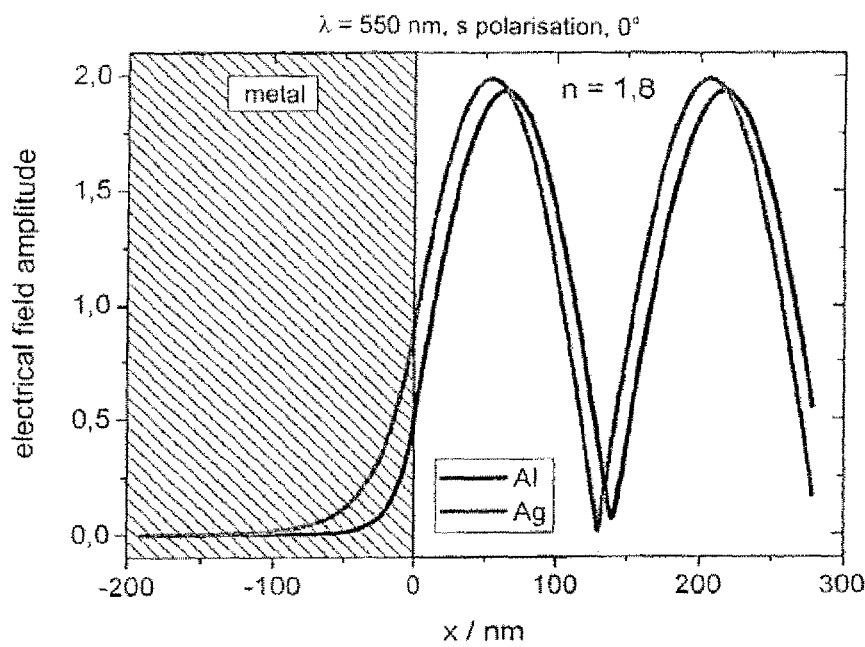
Figure 8:
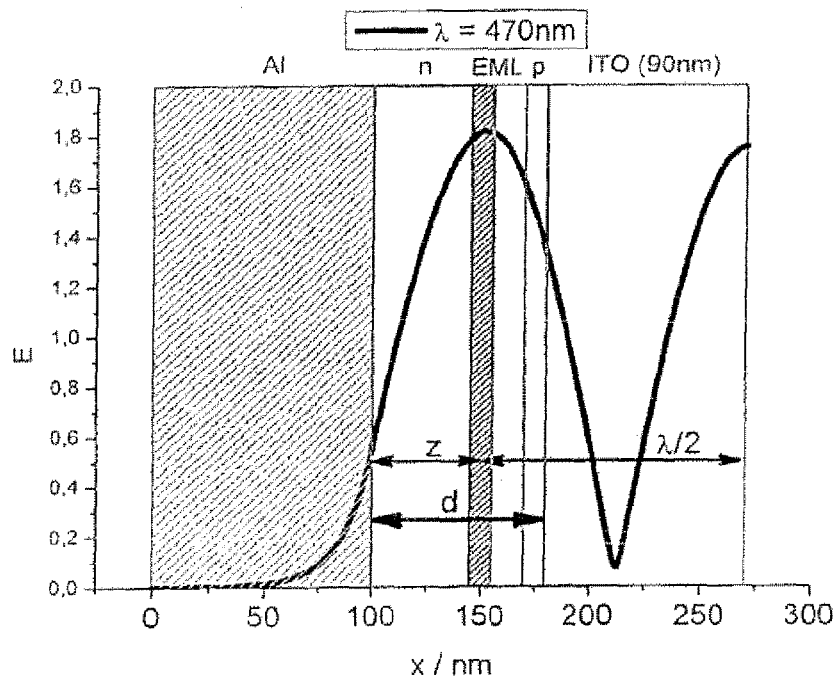
Figure 9:
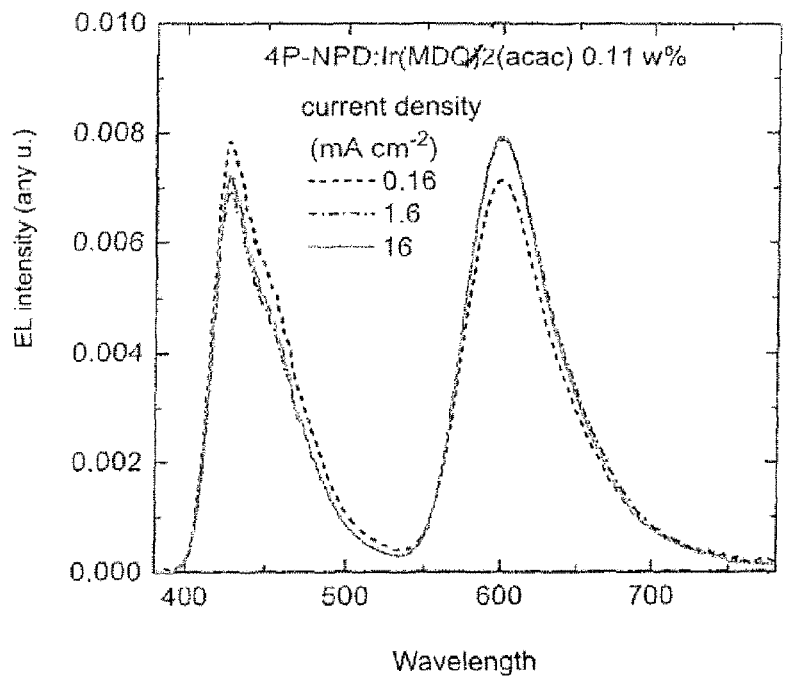
Figure 10:
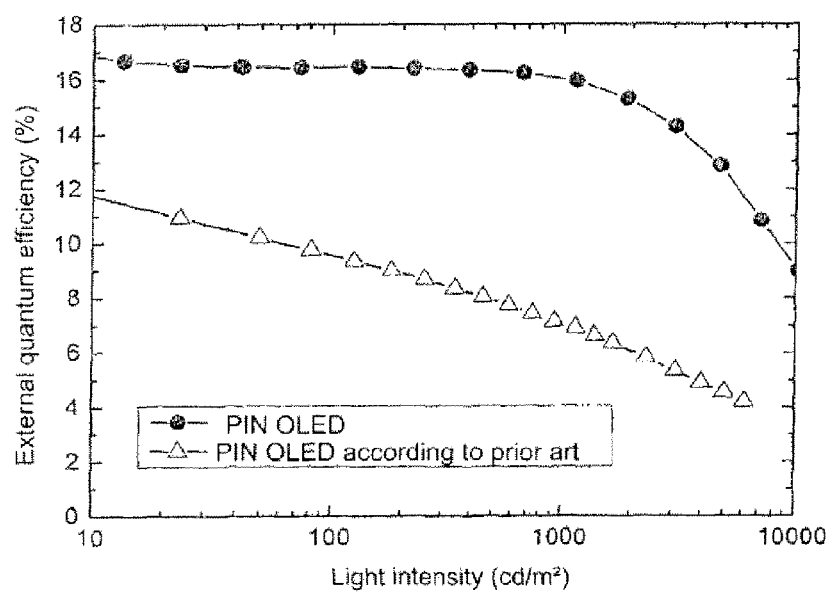
Figures 13, 13A, 13B:
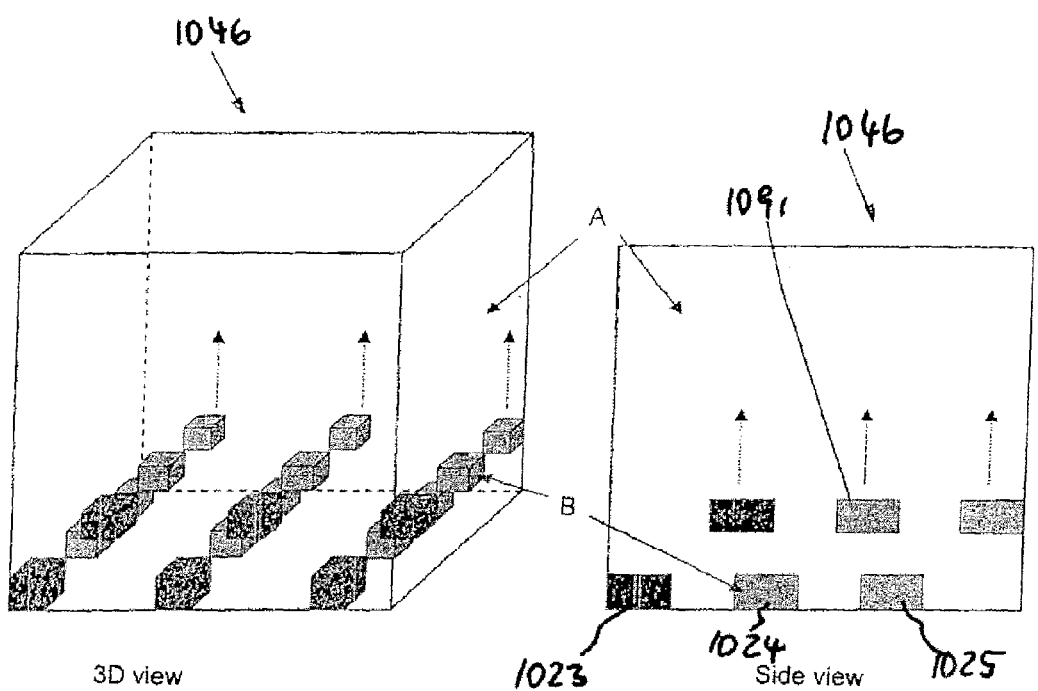
Figure 14:
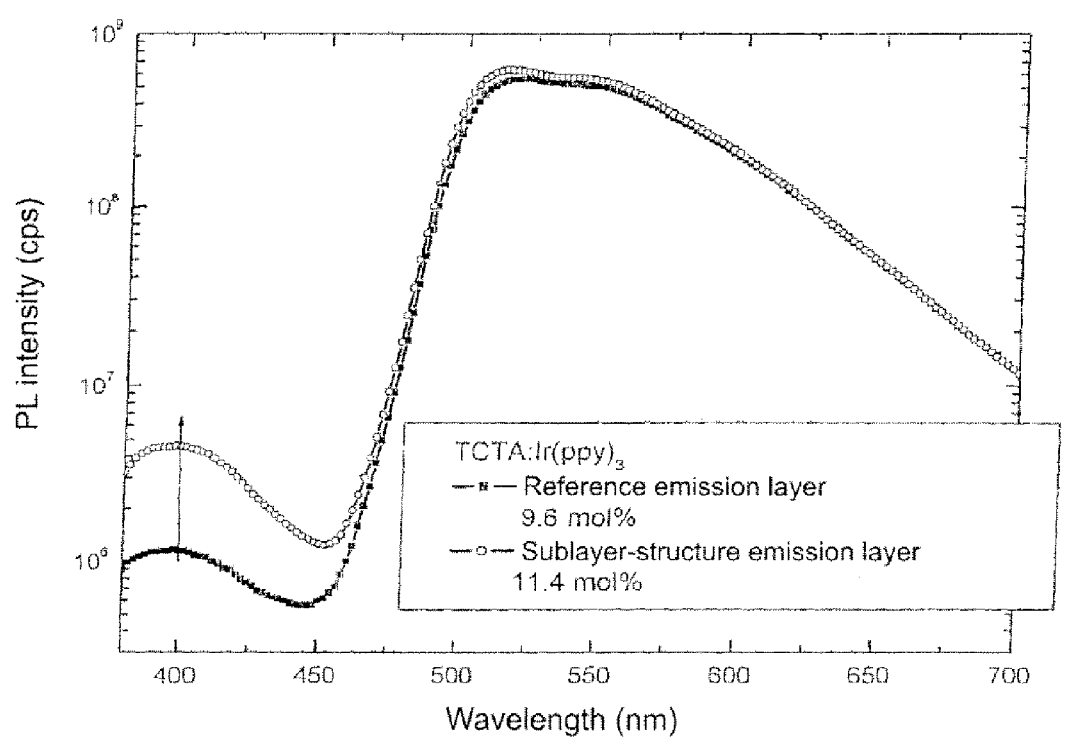
Figure 15:
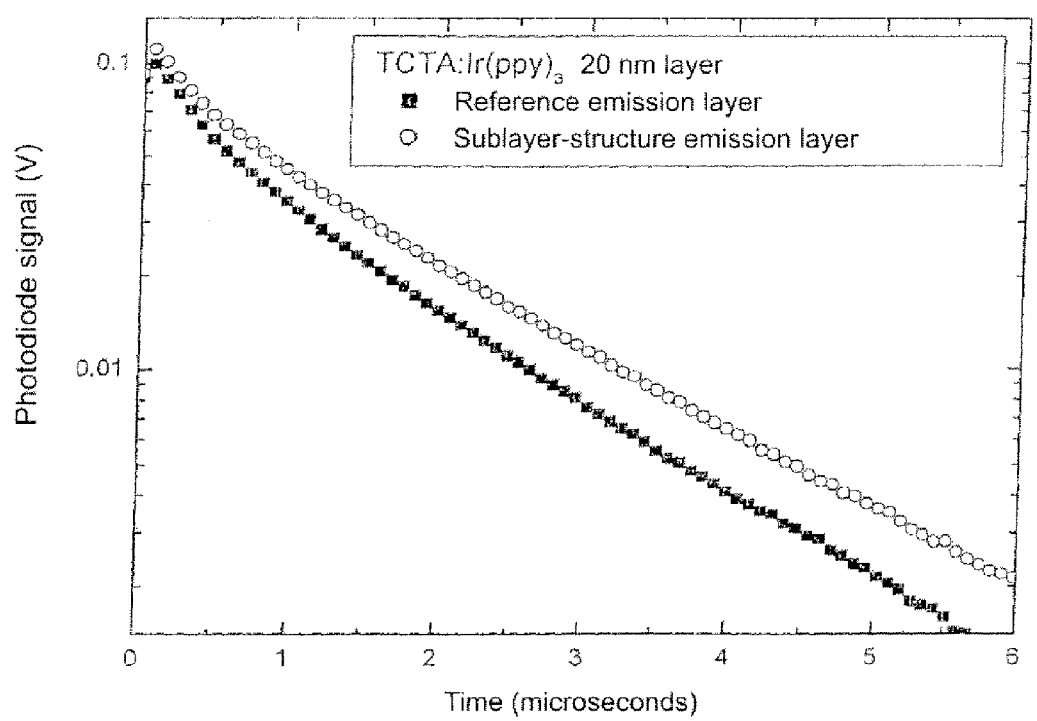
Figure 16:
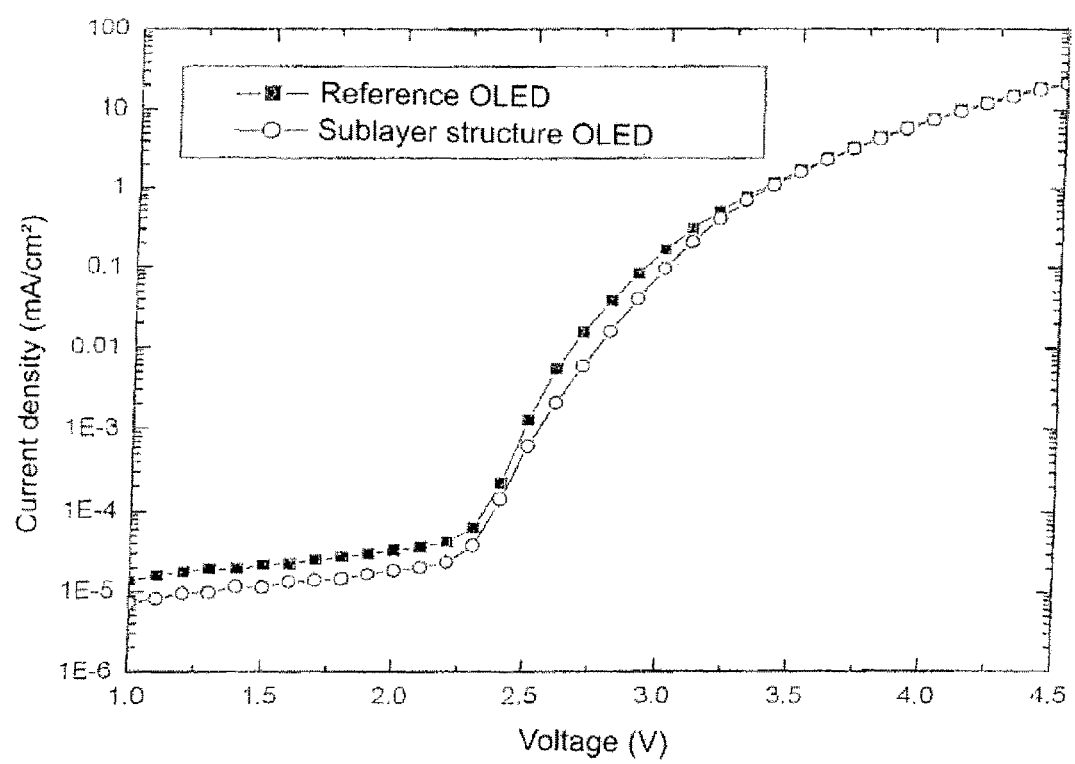
Figure 17:
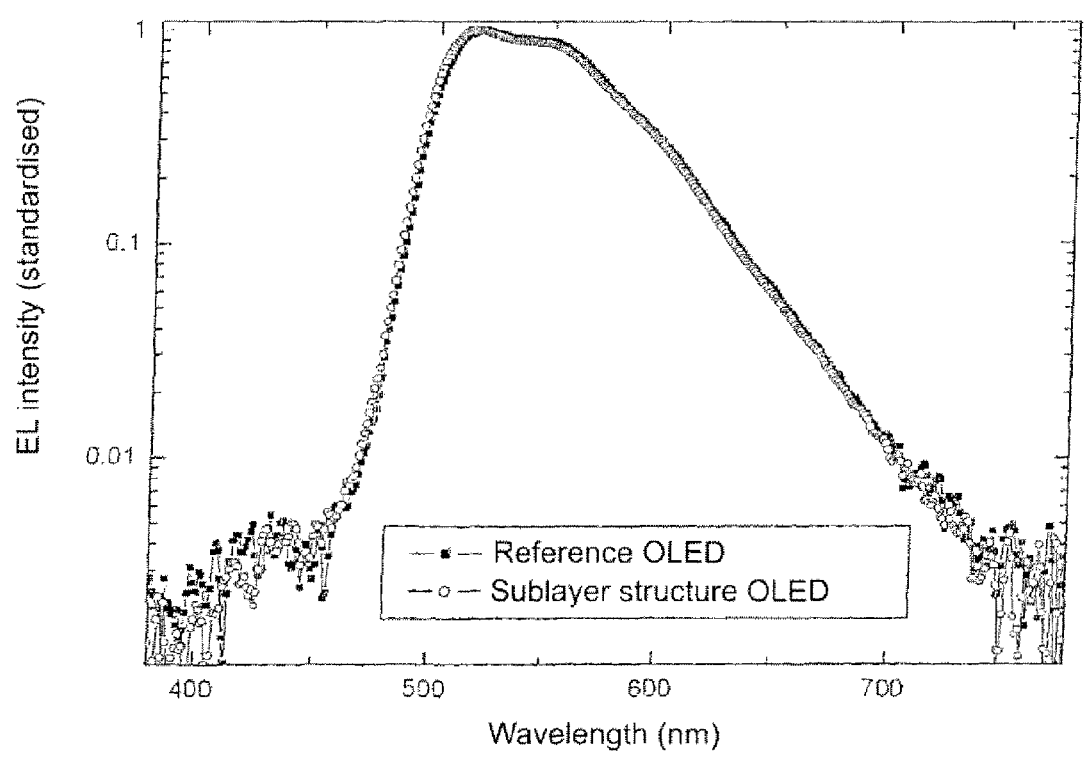
Figure 18:
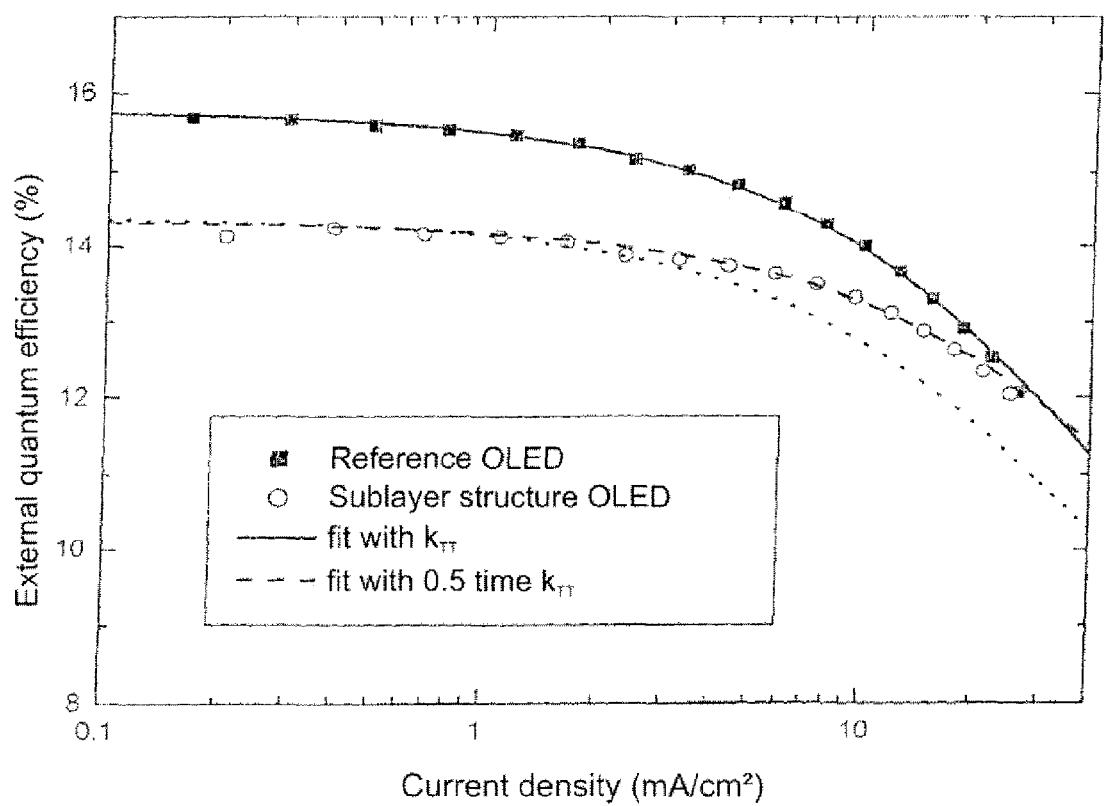
Figure 19:
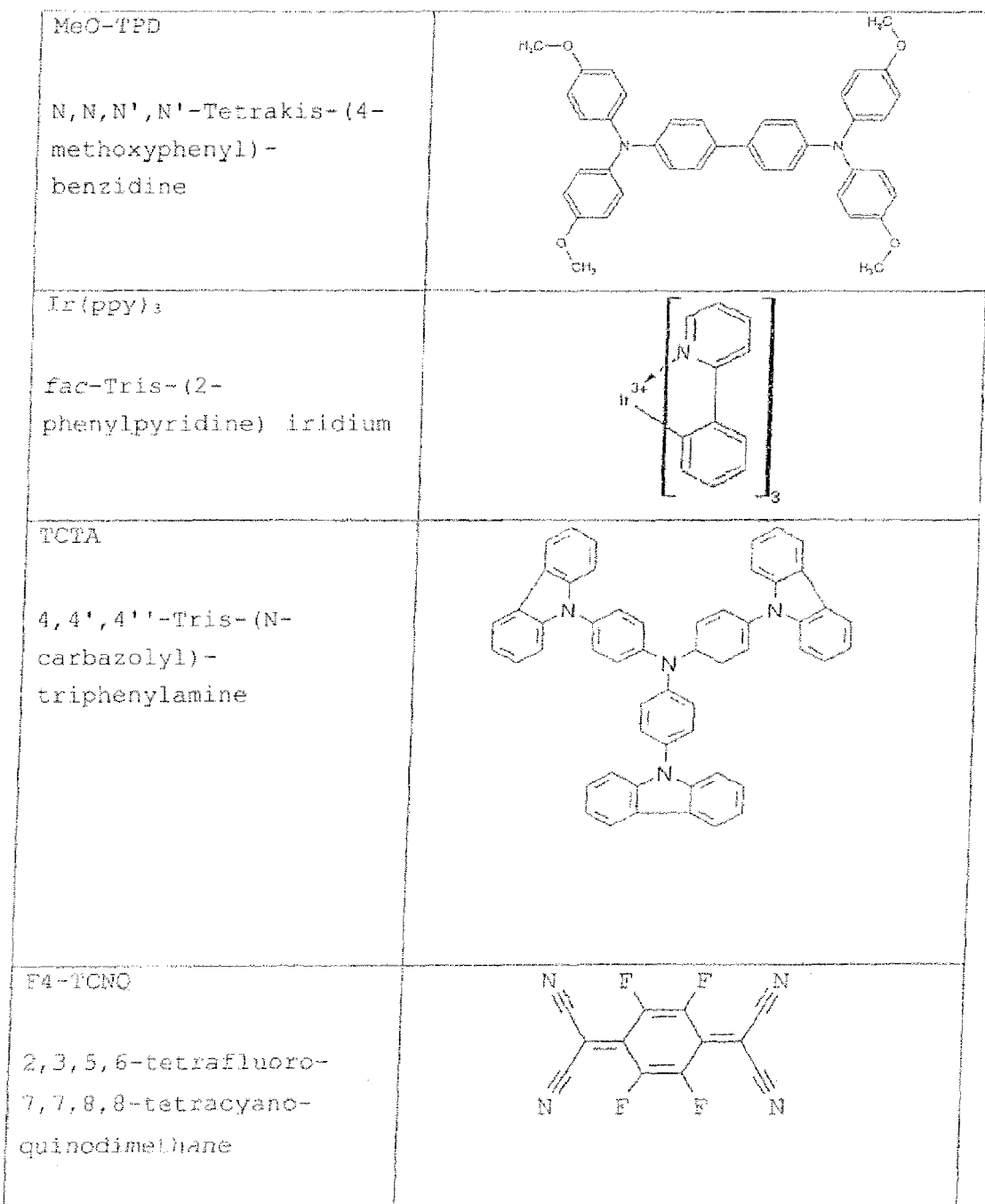
Figure 20:
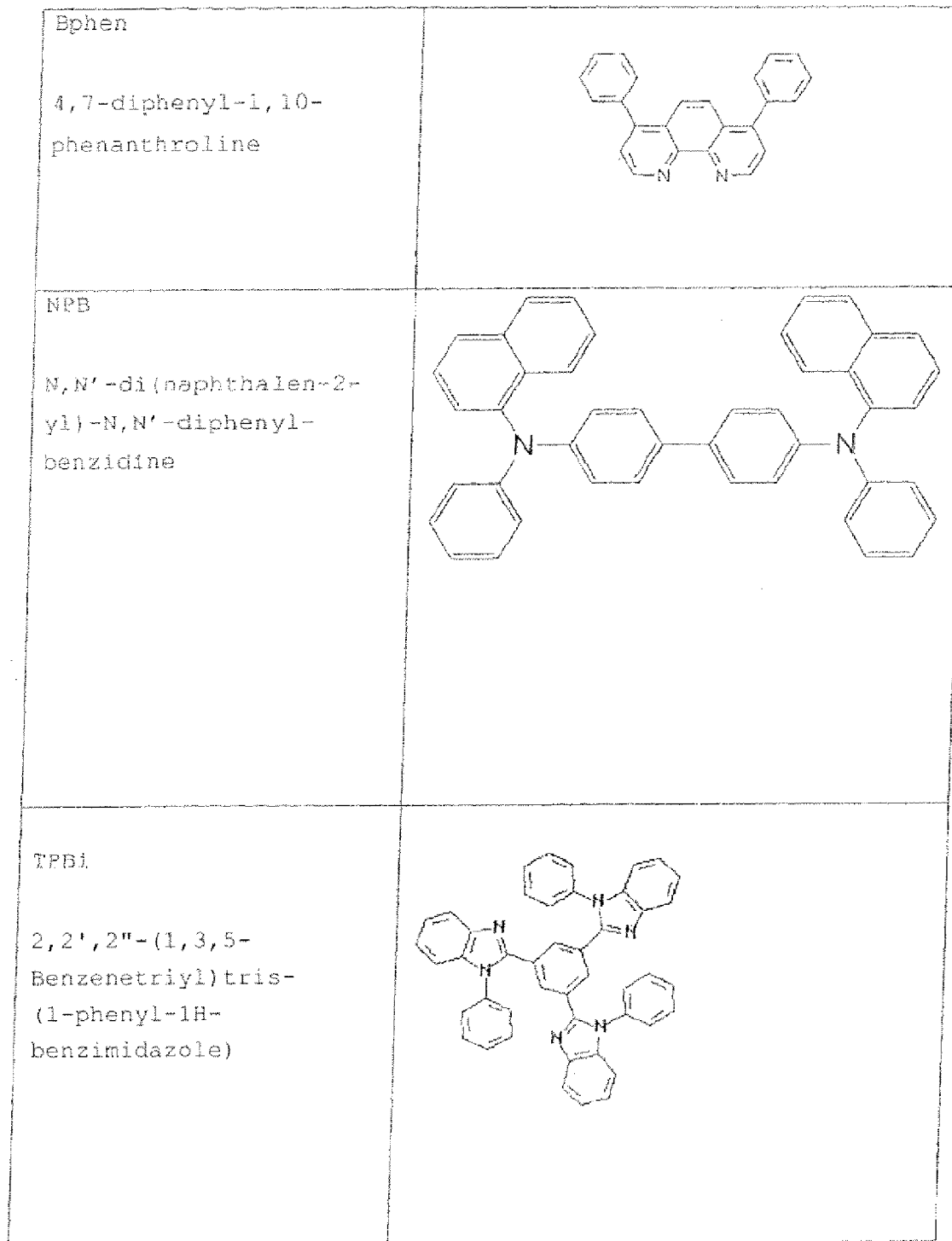
Figure 21C:
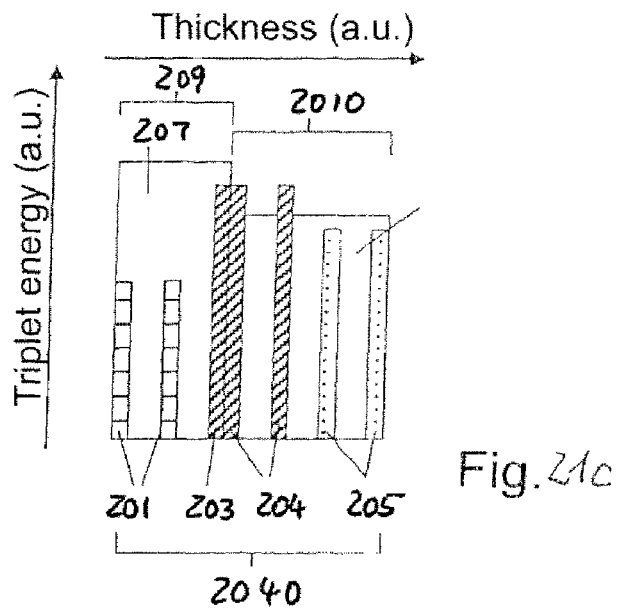
Figure 21D:
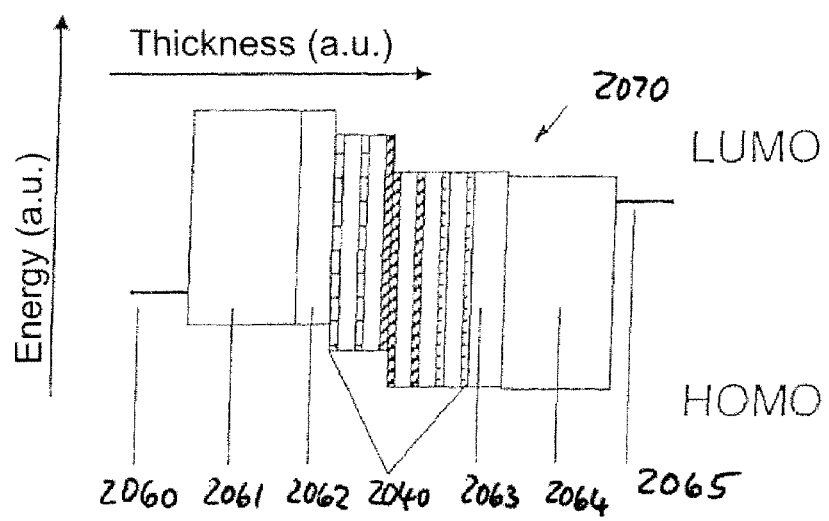
Figure 22:
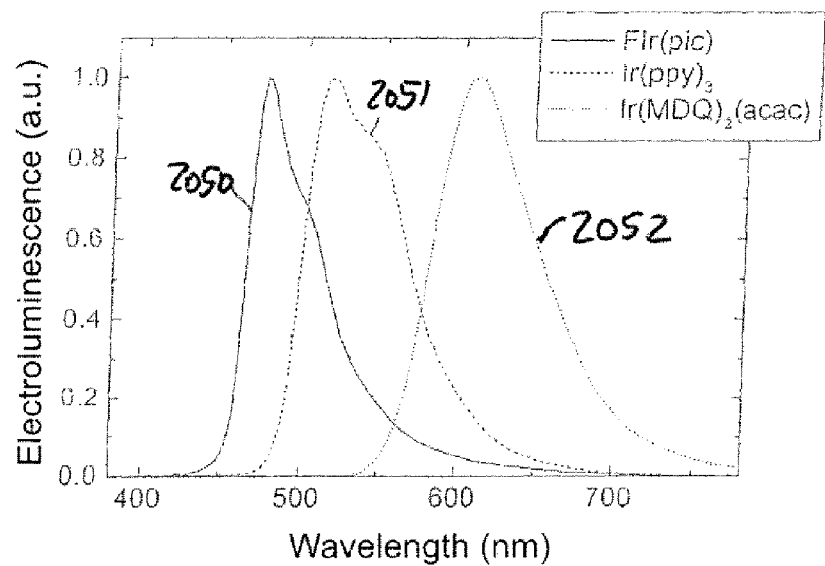
Figure 27:
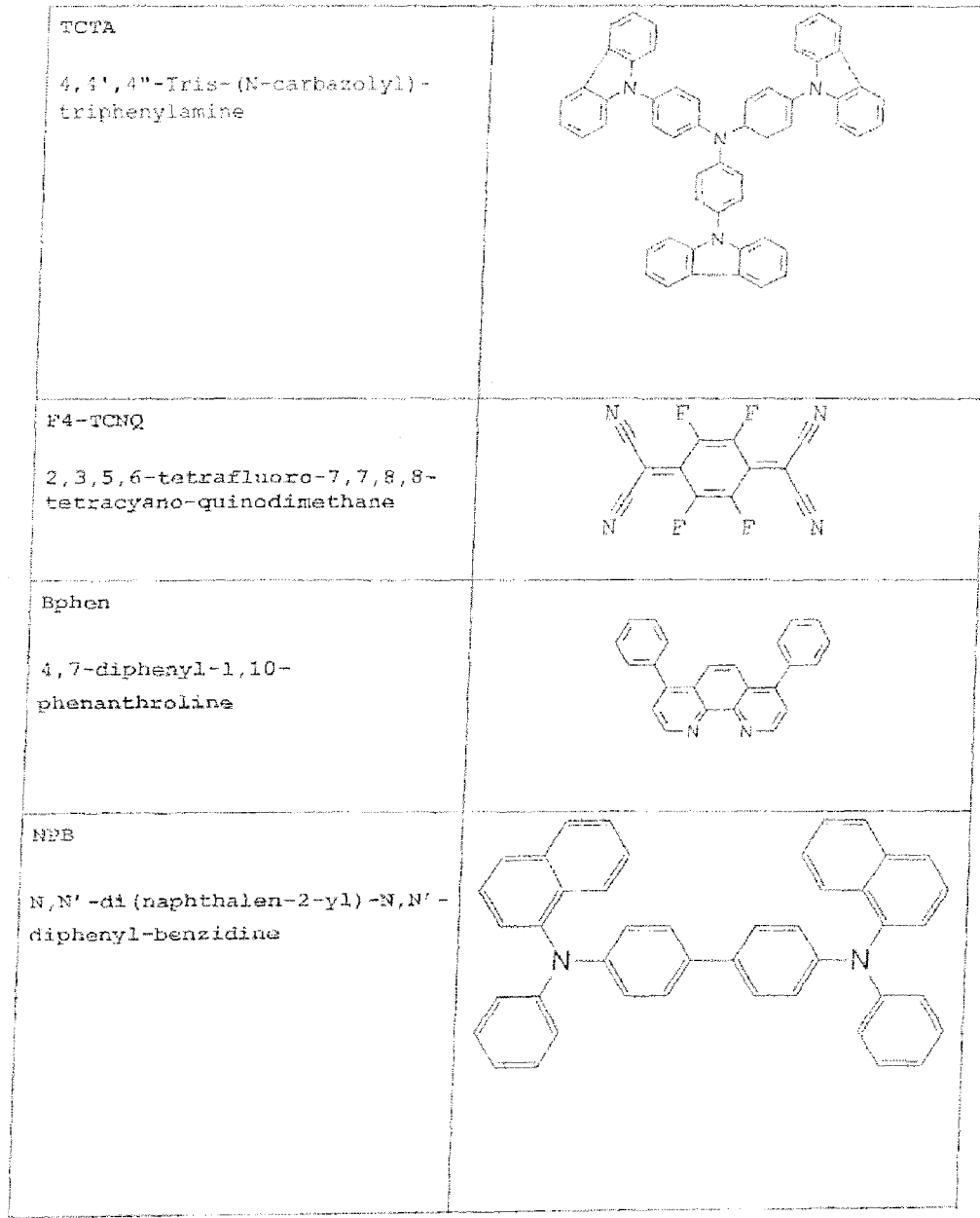
Figure 28:
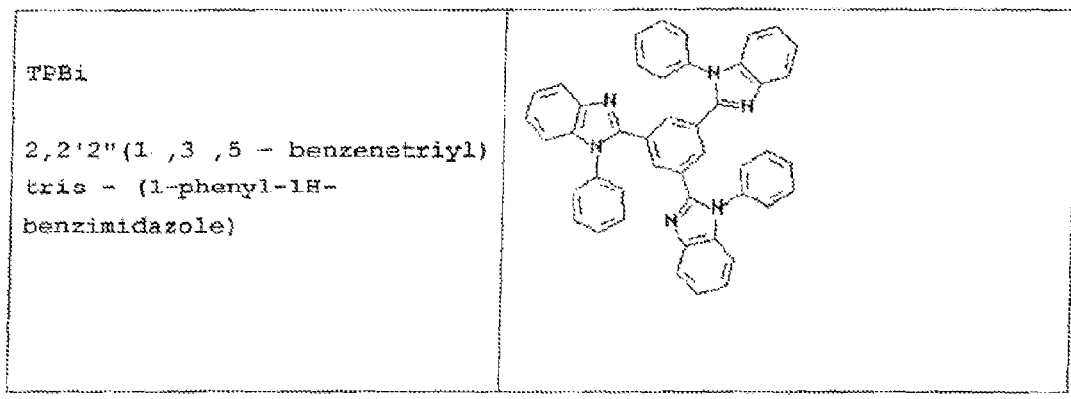

In the following, the invention is explained in more detail using exemplary embodiments with reference to figures of the drawing. They show:

FIG. 1 a schematic illustration of an array of layers of an organic light-emitting component, FIG. 2 a schematic illustration of an array of layers of a further organic light-emitting component, FIG. 3 a schematic illustration of an array of layers of a further organic light-emitting component, FIG. 4 a graphic illustration of the quantum efficiency as a function of the light intensity of a reference luminescent diode according to the prior art and an organic luminescent diode according to the invention, FIG. 5 a graphic illustration of an electroluminescence spectrum of the organic luminescent diode according to the invention, FIG. 6 a graphic illustration of an electric field distribution of the light emission of an organic light-emitting component with several emission layers with different emission wavelengths, FIG. 7 a graphic illustration of a field distribution of the light emission of two organic light-emitting components with different cathode materials (aluminium and silver), FIG. 8 a graphic illustration of an electric field distribution of light with a wavelength of 470 nm in an organic light-emitting component having layer thicknesses z and d optimised for this wavelength, which determine the distances of the emission zone from a cathode and a boundary surface of anode and glass substrate, FIG. 9 an electroluminescence spectrum, FIG. 10 a graphic illustration of the quantum efficiency as a function of the light intensity of a reference luminescent diode according to the prior art and another organic luminescent diode according to the invention, FIG. 11 a schematic illustration of a sequence of layers for a known OLED according to the prior art (11*a*), an OLED according to the invention (11*b*) and an OLED according to the invention in a work function (eV)/layer thickness diagram (11*c*), FIG. 12 a schematic illustration of an emission layer in a vertical sequence of layers B A (12*a*), B C (12*b*), B C+D (12*c*) and B C D (12*d*) in which A is a pure host material, B is a mixed system of host material and emitter dye, C is a host material differing from A with identical physical parameters as A, and D is a further host material differing from A with identical physical parameters as A, FIG. 13 a schematic illustration of an emission layer with A and B components for a realisation of a substructuring in all the spatial directions in a perspective view (13*a*) and a side view (13*b*), FIG. 14 a photoluminescence spectrum of in each case a 20 nm mixed-system layer TCTA:Ir(ppy)3 in which the dashed curve consisting of squares shows the reference emission layer with 9.6% by mole and the dashed curve consisting of circles show the sublayer-structure emission layer with 11.4% by mole, FIG. 15 several photoluminescence decay curves for samples from the preliminary examination according to FIG. 14, in which the dashed curve consisting of squares applies to the reference emission layer with 9.6% by mole and the dashed curve consisting of circles applies to the sublayer-structure emission layer with 11.4% by mole, the reference structure having higher TTA amounts, FIG. 16 a current density-voltage characteristic of an OLED in which the dashed curve consisting of squares applies to the reference emission layer with 9.6% by mole and the dashed curve consisting of circles applies to the sublayer-structure emission layer with 11.4% by mole and a little additional barrier can be noticed for the sublayer OLED, FIG. 17 electroluminescence spectra of components according to FIG. 14 to 16 in which the dashed curve consisting of squares applies to the reference emission layer with 9.6% by mole and the dashed curve consisting of circles applies to the sublayer-structure emission layer with 11.4% by mole, no host material fluorescence being detectable in the sublayer structure as well, FIG. 18 an illustration of the external quantum efficiency as a function of the current density for the components according to FIG. 14 to 17, in which the dashed curve consisting of squares applies to the reference emission layer with 9.6% by mole and the dashed curve consisting of circles applies to the sublayer-structure emission layer with 11.4% by mole, fit functions (solid line and dashed line) additionally being illustrated which quantify the loss in efficiency at high light intensities, FIG. 19 several organic materials which can be used in the components, FIG. 20 other organic materials which can be used in the components, FIG. 21 schematic illustrations of emission layer structures for an emission layer structure with the relative triplet energies of all the materials used when using FIr(pic), Ir(ppy)3 and Ir(MDQ)2(acac) (21*a*), an emission layer structure with the relative triplet energies of all the materials used when using FIr(pic), Ir(ppy)3 and Ir(MDQ)2(acac) (21*b*), an emission layer structure with the relative triplet energies of all the materials used when using FIr(pic), Ir(ppy)3 and Ir(MDQ)2(acac) (21*c*), and a schematic illustration of the energy diagram of the associated component, an OLED (21*d*), FIG. 22 basic emission spectra of emitter dyes which can be used (here: FIr(pic), Ir(ppy)3 and Ir(MDQ)2(acac)) in an emission layer structure, FIG. 23 emission spectra of two OLEDs with emission layer structures according to FIG. 21*a* and FIG. 21*b*, the spectra of which being an additive composition from the basic emission spectra shown in FIG. 22, FIG. 24 an emission spectrum of a third OLED according to FIG. 21*d* with a third emission layer structure according to FIG. 21*c* which shows proportions of all the basic emitter dyes, the colour coordinates of the emission being given according to the CIE standard, FIG. 25 the external quantum efficiency and the performance efficiency of the third emission layer structure according to FIG. 21*c* and FIG. 24 as a function of the light intensity, FIG. 26 useable organic materials for the emission layer structures of components: 1. Iridium bis-(4,6-difluorophenyl-pyridinato-N,C2)-picolinate, abbreviated as FIr(pic), 2. iridium(III) bis-(2-methyldibenzo[f,h]quinoxaline) (acetylacetonate), abbrev. as Ir(MDQ)2(acac), 3. N,N,N',N'-tetrakis-(4-methoxyphenyl)-benzidine, abbrev. as MeO-TPD, and 4. fac-tris-(2-phenylpyridine) iridium (Ir(ppy)3), FIG. 27 useable organic materials for the emission layer structures of components: 5. 4,4',4''-tris-(N-carbazolyl)-triphenylamine (TCTA), 6. 2,3,5,6-tetrafluoro-7,7,8,8-tetracyano-quinodimethane (F4-TCNQ), 7. 4,7-diphenyl-1,10-phenanthroline (Bphen), 8. N,N'-di(naphthalen-2-yl)-N,N'-diphenyl-benzidine (NPB), and FIG. 28 useable organic material: 9. 2,2'2''-(3,5-benzentriyl)tris-(1-phenyl-1H-benzimidazole) (TPBi).

FIG. 1 shows a schematic illustration of an array of layers of an organic light-emitting component.

Two electrodes, anode 1 and cathode 2, are formed between which an organic region with a hole transport layer 3 made of an organic substance, optionally doped with an acceptor material, an electron blocking layer 7 made of an organic substance, an organic light-emitting region 4 with an emission layer EML 1, a hole blocking layer 6 made of an organic substance and an electron transport layer 5 made of an organic substance, optionally doped with a donor material, is arranged. The emission layer EML 1 comprises a fluorescent emitter emitting light predominantly in the blue or blue-green spectral region, one or more phosphorescent emitters emitting light predominantly in the non-blue spectral region being admixed with the fluorescent emitter. In alternative embodiments, the electron blocking layer 7 and/or the hole blocking layer 6 are omitted.

The OLED functions as follows: Holes are injected through the anode 1 into the hole transport layer 3, migrate through the hole transport layer 3 and reach, optionally through the electron blocking layer 7, the light-emitting organic region 4. Electrons are injected through the cathode 2 into the electron transport layer 5, migrate through the electron transport layer 5 and reach, optionally through the hole blocking layer 6, the light-emitting organic region 4. Holes and electrons converge in the light-emitting organic region 4 and recombine on the blue or blue-green fluorescent emitter molecules to excited states, so-called excitons which are formed in triplet and singlet states. The singlet excitons recombine to some extent emitting blue fluorescent light, to some extent an energy transfer in accordance with the transfer mechanism according to Förster to the phosphorescent emitters takes place. The major part of the triplet excitons on the fluorescent blue or blue-green emitter is transmitted to the non-blue phosphorescent emitters where they recombine, emitting phosphorescent light.

FIG. 2 shows a schematic illustration of an array of layers of a further organic light-emitting component e. In FIG. 2, the same reference numbers are used for the same features as in FIG. 1.

The light-emitting organic region 4 consists of two emission layers EML 1 and EML 2. The additional emission layer EML 2 comprises one or more phosphorescent emitters predominantly emitting in the non-blue spectral region. EML 1 is formed such that it predominantly conducts holes, EML 2 is formed such that it predominantly conducts electrons. Thus, the main recombination zone is arranged in the region of the boundary surface between EML 1 and EML 2. The term main recombination zone refers to a spatial area within the region of the organic layers between the anode and the cathode in which at least about 50% of the injected charge carriers recombine.

FIG. 3 shows a schematic illustration of an array of layers of another organic light-emitting component. In FIG. 3, the same reference numbers are used for the same features as in FIG. 2. EML 1 is formed such that it predominantly conducts electrons, EML 2 is formed such that it predominantly conducts holes. Thus, the main recombination zone is arranged in the region of the boundary surface between EML 1 and EML 2.

In the following, exemplary embodiments for OLEDs are described to further explain the invention. Initially, a reference OLED according to the prior art with the following array of layers was produced:

1) Anode: indium-tin-oxide (ITO)
2) P-doped hole transport layer: 60 nm N,N,N',N'-tetrakis-(4-methoxyphenyl)-benzidine (MeO-TPD) doped with tetrafluoro-tetracyano-quinodimethane (F4-TCNQ)
3) Intermediary layer on the side of the holes: 10 nm 2,2',7,7'-tetrakis-(N,N-diphenylamino)-9,9'-spirobifluorene (spiro-TAD)
4) Red emission layer: 20 N,N'-di(naphthalen-1-yl)-N,N'-diphenyl-benzidine (α-NPD) doped with iridium(III) bis-(2-methyldibenzo[f,h]quinoxaline) (acetylacetonate) (ADS_076RE) (5 percent by weight)
5) Blue emission layer: 20 nm N,N'-di-1-naphthalenyl-N,N'-diphenyl-[1,1':4',1'':4'',1'''-quaterphenyl]-4,4'''-diamine (4P-NPD)
6) Green emission layer: 10 nm 1,3,5-tris(N-phenylbenzimidazol-2-yl)benzene (TPBi) doped with fac-tris-(2-phenylpyridine) iridium (Ir(ppy)3) (4 percent by weight)
7) Intermediary layer on the side of the electrons: 10 nm bathophenanthroline (BPhen)
8) N-doped electron transport layer: 30 nm BPhen doped with Cs
9) Cathode: 100 nm aluminium According to FIG. 4, this OLED in the so-called pin design shows with increasing light intensity a continuous decrease of the external quantum efficiency. As already explained, this results from the high accumulation of triplet excitons in the main recombination zone which is arranged in the region of the boundary surface between layer 5 (blue emission layer) and layer 6 (green emission layer), as layer 5 is formed such that it predominantly conducts holes and layer 6 is formed such that it predominantly conducts electrons.

An exemplary embodiment for an OLED according to the invention envisages the following layer structure:

| | |
|---|---|
| 1.1 | Anode: indium-tin-oxide (ITO) |
| 1.2 | P-doped hole transport layer: 60 nm N,N,N',N'-tetrakis-(4-methoxyphenyl)-benzidine (MeO-TPD) doped with tetrafluoro-tetracyano-quinodimethane (F4-TCNQ) |
| 1.3 | Intermediary layer on the side of the holes: 10 nm N,N'-di(naphthalen-1-yl)-N,N'-diphenyl-benzidine (α-NPD) |
| 1.4 | Blue and red emitting layer: N,N'-di-1-naphthalenyl-N,N'-dipheny-[1,1':4',1'':4'',1'''-quaterphenyl]-4,4'''-diamine (4P-NPD) doped with iridium(III) bis-(2-methyldibenzo[f,h]quinoxaline) (acetylacetonate) (ADS_076RE) (0.15 percent by weight) |
| 1.5 | Green emission layer: 10 nm 1,3,5-tris(N-phenylbenzimidazol-2-yl)benzene (TPBi) doped with fac-tris-(2-phenylpyridine) iridium (Ir(ppy)3) (1 percent by weight) |
| 1.6 | Intermediary layer on the side of the electrons: 10 nm bathophenanthroline (BPhen) |
| 1.7 | N-doped electron transport layer: 30 nm BPhen doped with Cs |
| 1.8 | Cathode: 100 nm aluminium |

This OLED is a white OLED in the so-called pin design which shows a light intensity of more than 1000 cd/m$^2$ at a voltage of 4.2 V. According to FIG. 5, the electroluminescence spectrum has three peaks at 434 nm, 507 nm and 603 nm; the colour coordinates according to CIE 1931 are x=0.39 and y=0.35. In particular, both the fluorescence of the 4P-NPD (blue emission) and the phosphorescence of the ADS_076RE (red emission) from the mixed layer 4 can clearly be seen.

The external quantum efficiency (see FIG. 4) is virtually constant up to a light intensity of about 1500 cd/m2 while it has already dropped by a factor of about 2 in the reference component. When directly comparing it with the reference OLED according to the prior art, the external quantum efficiency of the OLED according to the invention is higher from a light intensity of about 500 cd/m2.

Another exemplary embodiment for an OLED according to the invention envisages the following layer structure:

| 2.1 | Anode: indium-tin-oxide (ITO) |
|---|---|
| 2.2 | P-doped hole transport layer: 60 nm N,N,N',N'-tetrakis-(4-methoxyphenyl)-benzidine (MeO-TPD) doped with tetrafluoro-tetracyano-quinodimethane (F4-TCNQ) |
| 2.3 | Intermediary layer on the side of the holes: 10 nm 1,1 -bis-(4-methylphenyl)-aminophenyl)-cyclohexane (TAPC) |
| 2.4 | Blue and red emitting layer: N,N'-di-1-naphthalenyl-N,N'-diphenyl-[1,1':4',1":4",1"'-quaterphenyl]-4,4"'1-diamine (4P-NPD) doped with iridium(III) bis-(2-methyldibenzo[f,h]quinoxaline) (acetylacetonate) (ADS_076RE) (0.12 percent by weight) |
| 2.5 | Green emission layer: 10 nm 1,3,5-tris(N-phenylbenzimidazol-2-yl)benzene (TPBi) doped with fac-tris-(2-phenylpyridine) iridium (Ir(ppy)3) (0.8 percent by weight) |
| 2.6 | Intermediary layer on the side of the electrons: 10 nm TPBi |
| 2.7 | N-doped electron transport layer: 30 nm bathophenanthroline (BPhen) doped with Cs |
| 2.8 | Cathode: 100 nm aluminium |

Other blocker materials were used in comparison with the preceding exemplary embodiment. Furthermore, the percentages of the phosphorescent emitters are modified. Through this, a higher quantum efficiency than with the reference OLED may be achieved over the entire current density range.

The component according to the further exemplary embodiment is a white-light emitting organic component in the so-called pin design which shows a light intensity of more than 1000 cd/m2 at a voltage of 3.7 V. When directly comparing it with the reference OLED according to the prior art, the external quantum efficiency (see FIG. 10) is markedly higher over the entire measured light-intensity range of about 10 cd/m2 to about 10,000 cd/m2. In particular, it can be seen that the external quantum efficiency remains virtually constant up to a light intensity of about 1500 cd/m2, in contrast to the reference OLED which shows a strong decrease in efficiency, already starting at low light intensities of 10 cd/m2.

An emission zone can be defined for the light-emitting organic components with a layer structure, irrespective of their individual formation, by means of a spatial distribution of the in terms of the emission relaxing excitons which depends on the charge carrier balance, the exciton diffusion and the like. The emission zone thus forms a section within the emission layer of the component in which the major part of the light is generated. If it is assumed that the emission zone extends over a wide region of the emission layer, the emission zone and emission layer may be treated approximately in the same way. In the most simple case, a distance z between the electrode of the component implemented as the cathode and the emission zone then corresponds to the distance between electrode and centre of the emission layer (see FIG. 6). Through this, it is at the same guaranteed that the wavelength region around λblue likes couples to the optical field in an optimum way.

The description of an actual penetration depth PD is carried out by means of the phase displacement Φ cathode of the light during the reflection. This displacement depends on the cathode material (metal) and the wavelength and is calculated from the optical constants of the adjacent materials (see, for example, Dodabalapur et al., Journal of Applied Physics, 80, 6954 (1996)): $ET=\lambda/4-|(\Phi cathode*\lambda/4\pi)|$, with $\Phi cathode=\arctan(2n_0k_m/(n_o^2-n_m^2-k_m^2))$ wherein no, nm, km . . . are optical constants of the organics and the metal material of the cathode. In an exemplary embodiment, a cathode material Al results in λblue=470 nm, (wavelength in organics: λblue/no=266 nm), and no(BPhen:Cs)=1.76, nm(AL)=0.538, km(AL)=4.81: PD 266 nm/4–14.75 nm=about 52 nm. 550 nm results in about 64 nm for Al and 55 nm for Ag (cf. FIG. 7).

Microresonator effects occur in bottom-emitting OLEDs mainly because of the difference in the refractive index between ITO and glass substrate. Thus, the cavity length at a fixed ITO layer thickness is given by dcav+dITO. The resonance condition is approximately met if the following applies: $(2m+1)\pi/4=\Sigma(d_i*2\pi*n_i/\lambda)+|\Phi cathode/2|$, (m=1, 2, . . . ). The condition ensures that a field maximum occurs in the boundary area between ITO and glass substrate. In other words: 3/4, 5/4, 7/4 . . . times the wavelength fit between ITO and glass and Al (+actual penetration depth). The condition specifies reference values. The precise optimisation takes place via a simulation by means of thin-film optics. In an exemplary embodiment, the following applies: λreso=470 nm; dITO=90 nm, nITO=2; d1=45 nm, n1=1.76; dEMLs=25 nm, nEMLs=2, n2=2, nAl=0.538 kAl=4.81.

This results in a "first maximum": (m=1)=>d2=10 nm d=45 nm+25 nm+10 nm=about 80 nm, and a "second maximum": (m=2)=>d2=145 nm=>d=45 nm+25 nm+145 nm=about 215 nm.

The proportion of fluorescent light of the light generated in the emission layer is adjusted by means of the concentration ratio of fluorescent and phosphorescent material in the emission layer. The more fluorescent emitter it contains, the higher is the proportion of the fluorescent light in the total light emission. The fluorescent light can then be measured experimentally by recording an electroluminescence spectrum and determining the intensity proportion of the emitter fluorescing within the blue spectral region.

In another exemplary embodiment, the following structure is formed: glass/ITO (90 nm)/MeO-TPD:F4-TCNQ (60 nm, 4% by mole)/☐-NPD (10 nm)/4P-NPD:Ir(MDQ)2(acac) (30 nm, 0.11 percent by weight)/TPBi (10 nm)/BPhen:Cs (30 nm)/Al (100 nm). The emission layer consists of a compact layer (matrix material) of the blue fluorescent emitter 4P-NPD to which a proportion of 0.11 percent by weight of the red phosphorescent emitter Ir(MDQ)2(acac) is admixed. The electroluminescence spectrum has about 50% of its intensity in the blue region. This therefore corresponds to a proportion of fluorescent light of about 50% in the entire light emission. FIG. 9 shows an electroluminescence spectrum for the preceding, described exemplary embodiment.

Depending on the application, it makes sense to aim for a compromise between high light output and colour purity. Thus, it can be sufficient to only get close to a resonance condition met for blue light by means of adjusting the layer thickness d2.

FIG. 10 shows a graphic illustration of the quantum efficiency as a function of the light intensity of a reference luminescent diode according to the prior art and another organic luminescent diode according to the invention.

A schematic illustration of a component 1010 for phosphorescent light emission from triplet states is shown in FIG. 11b, the component 1010 comprising an anode for hole injection 101, at least one hole-injecting or hole-transporting layer 102, 103 (hole transport layer), at least one emission layer 104, at least one electron-injecting or electron-transporting layer 105, 106 (electron transport layer) and a cathode for electron injection 107, the layers 102, 103, 104, 105, 106 consisting of organic material.

According to the invention, the emission layer 1042 has a substructuring of zones 1014, 1016, 1018, 1020, 1022 of a mixed system 108 consisting of at least one of at least one of a host material 109 and at least one emitter dye 1011 and of zones 1015, 1017, 1019, 1021 of at least one host material 109, the zones 1014, 1016, 1018, 1020, 1022 of the mixed system 108 being spatially separated from another by the zones 1015, 1017, 1019, 1021 of the host material 109, the triplet energies Thost of the host material 109 being higher than the triplet energies Temitter of the emitter dye 1011, with Thost>Temitter.

Neighbouring boundary surfaces 1012, 1013 of the zones 1014, 1016, 1018, 1020, 1022 of the mixed system 108 are separated from each other by a predefined distance a with a minimum value within the nanometer range. The minimum value of the distance a between the neighbouring boundary surfaces 1012, 1013 of the zones 1014, 1016, 1018, 1020, 1022 of the mixed system 108 can be two nanometers. In this connection, the host material 109 as well as the emitter dye 1011 of different emission layers 1042, 1043, 1044, 1045, 1046 can in each case be different.

The emission layer 1042 has layer-like zones 1014, 1016, 1018, 1020, 1022 of the mixed system 108 of host material 109 and emitter dye 1011 and layer-like zones of the host material 109 by means of a predefined substructuring, the substructuring being formed by a sequential succession of layer-like zones in the form of a vertical structuring of zones 1015, 1017, 1019, 1021 of pure host material with a thickness of at least two nanometers and mixed-system zones 1014, 1016, 1018, 1020, 1022 of host material and phosphorescent light-emitting emitter dye.

Several schematic illustrations of the emission layers 1042, 1043, 1044, 1045 are illustrated in a vertical sequence of layers with regard to the vertical structuring in FIG. 12, wherein in FIG. 12a the emission layer 1034 with alternating layers B and A, in FIG. 12b the emission layer 1043 with alternating layers B and C, in FIG. 12c the emission layer 1044 with alternating layers B and C+D and in FIG. 12d the emission layer 1045 with alternating layers B, C and D are shown, and wherein A is pure host material, B is a mixed system of host material 109 and emitter dye 1011, C is a material different from A with the physical parameters applying for A, D is a further material different from A with the physical parameters applying for A.

The hole transport layer 102 may be p-doped and/or the electron transport layer 106 may be n-doped. However, the hole transport layers 102, 103 may also be combined in one layer and/or the electron transport layers 105, 106 may be combined in one layer.

The zones 1015, 1017, 1019, 1021 of pure host material 109 can be replaced by zones of another host material 191 (not shown), the triplet energy Thost191 of the latter being higher than the triplet energy Temitter of the employed emitter dye, with Thost191>Temitter.

The zones 1015, 1017, 1019, 1021 of pure host material 109 can be replaced by zones of a material combination of several materials, the triplet energies Tcomb of the latter being higher than the triplet energies Temitter of the emitter dye 1011, with Tcomb>Temitter for all the materials.

Different zones 1015, 1017, 1019, 1021 of pure host material can be replaced by zones of several materials in any sequential order. Different zones 1014, 1016, 1018, 1022, 1022 of the mixed system may also contain different phosphorescent emitter dyes.

The zones of a mixed system may contain several different host materials and/or several different emitter dyes.

The component 1010 may contain additional emission layers with a fluorescence emission from singlet states, the additional emission layers being pure zones or mixed systems. In mixed systems, the concentration of the emitter dye in the host material 109 can be between 0.1% by mole and 50% by mole. The distance of zones of pure host material may be between 2 nm and 20 nm. The zones of the mixed system of host material and emitter dye may have a spatial expansion of 0.5 nm to 100 nm.

In the emission layer 1046, as shown in FIG. 13a, 13b, the zones 1023, 1024, 1025 of the mixed systems 108 and/or the zones 1091 of the host materials may be formed as layers or spherical or cubic bodies or as bodies with another given geometry.

The zones formed as layers can consist of small molecules applied by vapour-deposition under vacuum or partly of polymers. In the method for the production of components which contain at least one phosphorescent light-emitting emission layer, the emission layer 1042, 1043, 1044, 1045; 1046 is generated by means of a targeted substructuring of zones 1014, 1016, 1018, 1020, 1022; 1023, 1024, 1025 of at least one mixed system 108 of at least one host material 109 and at least one emitter dye 1011 and of zones 1015, 1017, 1019, 1021; 1091 of a host material 109, the zones 1014, 1016, 1018, 1020, 1022 of the mixed system 108 being positioned spatially defined from another, separated by zones 1015, 1017, 1019, 1021; 1091 of the host material 109, the triplet energies Thost of the latter being higher than those of the emitter dye 1011 Temitter (Thost>Temitter), the substructuring being performed by a sequential succession of zones in the form of a vertical structuring of layers 1015, 1017, 1019, 1021 of the host material 109 having a thickness of at least two nanometers and mixed layers 1014, 1016, 1018, 1020, 1022 of host material 109 and phosphorescent emitting emitter dye 1011 or by a predefined distributed array of zones 1023, 1024, 1025 in the form of bodies of at least one mixed system 108 in at least one zone 1091 of a surrounding host material 109 or vice versa.

The vertical structuring may be performed during a mixed evaporation of host material 109 and emitter dye 1011 by means of an arrangement of mechanically displaceable baffles in front of the emitter dye source which interrupt the evaporation of the emitter dye 1011 periodically.

The substructuring may also be achieved by means of a lateral structuring (not drawn) during a mixed evaporation of host material 109 and emitter dye 1011 by means of periodically inserting shadow masks between substrate and evaporation sources. A combination of vertical structuring and lateral structuring is also possible such that a substructuring in all the spatial directions can be achieved.

In particular, a substructuring of the emission layer is proposed. The formation of the remaining succession of layers can be based on structures known from the prior art. Both blocker layers 103, 105 have to have energetically higher triplet levels than the emitter dye. Hole and electron transport layer 102, 106 can optionally be p-doped or n-doped. In the case of the doping of the transport layers, the blocking layers 103, 105 are mandatory to avoid exciton annihilation at the boundary surfaces. Depending on the design, conventional, electrically undoped OLEDs can have a reduced number of layers. Here, functions of the layers 102 and 103 or 105 and 106, respectively, can in each case be combined in one material, for example.

The production of the individual organic layers can be performed by thermal evaporation, molecular beam epitaxy, spin-on deposition from solutions and chemical vapour deposition.

In general, the following conditions are set on the mixed system: a) the triplet energy Thost of the host material 109, 191 should be higher than or equal to the triplet energy Temitter of the emitter dye 1011, and b) the absorption spectrum of the emitter dye 1011 should overlap strongly with the emission spectrum of the host material 109, 191 such that an efficient exciton energy transfer can take place.

The requirement that the triplet energy Th of the host material 109, 191 should be higher than or equal to the triplet energy Te of the emitter dye 1011 means to efficiently capture the triplet excitons on the emitter dye 1011, i.e. prevent their diffusion to host states.

Further conditions relating to the sublayer structures are:
i) The zones of the mixed system 108 should be as thin as possible to minimise diffusion in the individual zones.
ii) The pure layers of the host material 109 should be as thin as possible to prevent fluorescence of the layers and to avoid electrical side effects, such as for example higher operating voltages, due to thick additional intrinsic layers in the emission layer 1042.
iii) The pure layers with the host material 109 have to be at least that thick that transfer processes according to Dexter between the substructures 1042 are not possible (>1-2 nm).

In a particular exemplary embodiment, the following materials are used in the OLED 10 in accordance with FIG. 11b, the chemical names of the materials being depicted in FIG. 19, 20:

| 101 | transparent ITO (indium-tin-oxide) on a glass substrate (90 nm) as the anode |
| 102 | MeO-TPD electrically doped with $F_4$-TCNQ, 4% by mole (35 nm) |
| 103 | NPB (10 nm) |
| 104 | TCTA:Ir(ppy)$_3$ (as the reference structure 1041 (20 nm) and as the sublayer structure 1042 (20 nm)) |
| 105 | TPBi (10 nm) |
| 106 | BPhen electrically doped with cesium (Cs) (55 nm) |
| 107 | reflecting aluminium layer (100 rim) as the cathode. |

The sublayer structure 1042 exactly corresponds with the structure explained in the preliminary examination in the following. Photoluminescence examinations of the TCTA:Ir (ppy)3 emission layer (reference structure 1041 and sublayer structure 1042) were performed as preliminary examinations. In this connection, a 20 nm emission layer was in each case vapour-deposited on quartz glass. The reference structure 1041 is a mixed-system layer of TCTA:Ir(ppy)3 having a concentration of approx. 10% by mole. The sublayer structure has the following sequence, the layer A=TCTA (host material) and the layer B=TCTA:Ir(ppy)3 (mixed system of host material and emitter dye) herein corresponding to: B(2 nm) [/A(2 nm)/B(1 nm)]6, with a total thickness of 20 nm which exactly corresponds with the emission zone thickness of the reference structure 1041.

The photoluminescence (PL) spectra of both structure layers 1041, 1042 can be seen in FIG. 14. Both show a strong emission of the Ir(ppy)3 triplet state with a maximum at approx. 510 nm. It can be seen for the sublayer structure 1042 that the fluorescence of TCTA, the host material, is increased. This is to be expected with optical excitation as virtually all the excitons are formed on the singlet state of TCTA such that a fraction is directly emitted instead of contributing to the energy transfer.

Both the structure layers 1041, 1042 were examined time-resolved, i.e. they were excited with a short laser pulse and the decay behaviour of the emission was measured. The corresponding decay curves are shown in FIG. 15. A purely exponential decay occurs when the triplet-triplet annihilation TTA is negligible, i.e. die excited species only relax directly. The curvature to be observed at the start of the decay is a measure for the bimolecular recombination, here the triplet-triplet annihilation TTA (cf. Reineke et al., Phys. Rev. B 75 (2007) 125328).

When comparing the sublayer structure 1042 with the reference structure 1041, the sublayer structure 1042 shows a markedly reduced contribution to the triplet-triplet annihilation TTA. The effect is even more obvious when the active volume, i.e. the volume in which Ir(ppy)3 is located, is smaller by approx. 213 than in the case of the reference structure 1041, i.e. the effective exciton density in the sublayer structure 1042 is higher by a factor of three.

As also is shown in FIG. 11c, the energetic positions of the highest occupied molecular orbital (HOMO) and the lowest unoccupied molecular orbital (LUMO) or of the work function (WF) in the case of the metals are indicated in the following list (Reineke et al., Phys. Rev. B 75 (2007) 125328. and Kundu et al., Adv. Funct. Mat. 13 (2003) 445):

| 101 | ITO/WF = −4.6 eV |
| 102 | MeO-TPD:$F_4$-TCNQ/HOMO = −5.1 eV/ LUMO = −1.9 eV |
| 103 | NPB/HOMO = −5.4 eV/LUMO = −2.3 eV |
| 104 | Host material: TCTA/HOMO = −5.9 eV/ LUMO = −2.7 eV; emitter dye: Ir(ppy)$_3$/ HOMO = −5.4 eV/LUMO = −2.4 eV |
| 105 | TPBi/HOMO = −6.2 eV/LUMO = −2.7 eV |
| 106 | BPhen:Cs/HOMO = −6.4 eV/ LUMO = −3.0 eV |
| 107 | Al/WF = −4.3 eV. |

The current density-voltage characteristics of both structures 1041, 1042 can be seen in FIG. 16. At low voltages, a slightly higher current flows in the reference structure 1041 at the same voltage. The reason for this are the additional pure TCTA layers which complicate the possible transport of charge carriers on the emitter molecule. However, as a whole, it is remarkable that the current density-voltage curves are virtually identical, i.e. no differences can be observed in the range of usual light densities (0.1 to 100 mA/cm2) such that the performance efficiency is not significantly influenced by the sublayer structure 1042.

The electroluminescence (EL) spectra of both structure layers 1041, 1042 are illustrated in FIG. 17. For both structure layers 1041, 1042, it applies that no fluorescence from the host material, TCTA, as shown in FIG. 14, is present. This proves that the energy transfer in both structures 1041, 1042 is very efficient and thus a high efficiency of the Ir(ppy)3 emission can be expected. The fact that, in contrast to the photoluminescence spectra, no TCTA fluorescence can be observed, is in stark contrast to the exciton generation in the case of electron luminescence. Here, 75% of the excitons in the triplet state are statistically already formed, both on TCTA and Ir(ppy)3, while in photoluminescence experiments, as mentioned above, virtually only singlet excitons are generated on TCTA.

FIG. 18 contains the external quantum efficiency EQE of both OLEDs 101, 1010 as a function of the current density j, with EQE=f(j). Both curves drop to high current densities which also means high light intensities. Both OLEDs 101, 1010 have comparable efficiencies of between 14% and 16% at low light intensities. The slightly lower efficiency of the sublayer structure 1042 is of statistical nature, the photoluminescence measurement with the same excitation density, as illustrated in FIG. 14 for the preliminary examination, demonstrates that both OLEDs 101, 1010 achieve identical intensities. The course of the external quantum efficiency of both OLEDs 101, 1010 shows that the sublayer structure 1042 presents a reduced decrease of the efficiency at high current densities. At current densities of 20-30 mA/cm2, the efficiencies of both OLEDs 101, 1010 are equal with an EQE of approx. 12%.

In this specific exemplary embodiment, the sublayer structure 1042 is only mentioned and illustrated representative for the other substructures 1043, 1044, 1045, 1046.

In the printed publication of Reineke et al., Phys. Rev. B 75 (2007) 125328, a model calculation is described which permits to model this loss in efficiency as a function of the current density. In this connection, the parameters important for the OLEDs 101, 1010 determining the loss in quantum efficiency are integrated: a) triplet life span τ, b) TTA rate constant kTT, c) rate constant of the triplet charge-carrier annihilation kP and d) thickness of the exciton recombination zone w.

The model calculation is based on the following rate equation which describes the development of the exciton density of excited emitter dyes over time:

$$\frac{dn}{dt} = -\frac{n}{\tau} - \frac{1}{2}k_{TT}n^2 - k_P\frac{\rho_c(j)}{e}n + \frac{j}{ew}.$$

In a continuous operation of the OLED, dn/dt=0 applies, the following stationary solution being found for above rate equation:

$$\frac{EQE(j)}{EQE_0} = \frac{ew}{j\tau}\left[\left(\frac{\left(\frac{1}{\tau} + k_P C j^{1/(l+1)}\right)^2 + 2k_{TT}\frac{j}{ew}}{k_{TT}^2}\right)^{\frac{1}{2}} - \frac{\left(\frac{1}{\tau} + k_P C j^{1/(l+1)}\right)}{k_{TT}}\right],$$

with the following parameters: j—current density, e—elementary charge, EQE—external quantum efficiency, C—constant describing the material properties, and 1—unit-free parameter characterizing the transport properties in the organic solid state. The latter equation also describes the external quantum efficiency η(j) as a function of the current density in a functional dependence of the above-mentioned parameters ($k_{TT}$, $k_P$, τ and w). Influences of different parameters, as indicated herein in the following for $k_{TT}$, can be evaluated by means of the model calculation.

The triplet life span r is determined to be 1.64 μs and recorded. For the TTA rate constant kTT and the rate constant of the triplet charge-carrier annihilation kP, values which were measured for other, comparable OLEDs 101 based on TCTA:Ir(ppy)3 are assumed and recorded (Reineke et al., Phys. Rev. B 75 (2007) 125328). The thickness of the recombination zone was used for the fitting. The result is the solid fitted line from FIG. 18.

To model the course of the sublayer structure 1042, only the rate constant for the triplet-triplet annihilation TTA is changed starting from the solid curve in FIG. 18 and namely, as illustrated in FIG. 18, halved. A good concordance with the experimental data can be observed with regard to the dashed curve in FIG. 18. The model calculation for the sublayer structure 1042 is again plotted (black dots) with the parameters of the reference structure 1041 to allow for a better comparison. In this connection, it becomes clear that the model calculation overestimates the loss in efficiency. The thickness of the recombination zone w is kept constant in the model calculation which makes sense on the basis of the following consideration. It was shown that the reference structure 1041 has a recombination zone of ca. 5 nm (Reineke et al., Phys. Rev. B 75 (2007) 125328). Due to its composition, the sublayer structure has effectively at most 8 nm emission zone available as the excitons are trapped in the mixed-layer parts. Furthermore, as mentioned in above structure, NPB is used as an electron blocker which due to its deep triplet level with a maximum wavelength of approx. 540 nm annihilates the Ir(ppy)3 localised at 510 nm, i.e. the excitons are transferred to the non-emitting NPB triplet level (Goushi et al., Journ. Appl. Phys. 95 (2004) 7798). Thus, a markedly lower starting efficiency should be expected for the sublayer OLED 1010 at low light intensities. From this, a conclusion can be drawn that the recombination zone thickness of the sublayer structure 1042 is smaller than the nominal 8 nm, thus comparable with the reference structure 1041.

If a current density jc is defined as the current density at which the efficiency corresponds to half the value of this at low light intensities in which annihilation mechanisms do not play any role, quantitative statements about the differences can be made based on the model calculation. In comparison with the reference structure 1041, the current density jc of 140 mA/cm2 can almost be doubled to 270 mA/cm2 for the substructure 1042.

The invention describes a possibility to reduce the loss in efficiency by a targeted modification of the substructure of the emission zone, i.e. the layer in which the charge carriers are transformed to light.

Emission layer structures 2020, 2030, 2040 of components 2070 for phosphorescent light emission from triplet states are illustrated in FIG. 21.

According to the invention, at least one emission layer 209, 2010 is present in an emission layer structure 2020, 2030 or 2040 for the generation of a matched coloured-light emission 2053, 2054 or white-light emission 2055, a substructuring being present in at least one of the emission layers 209, 2010 or at least one emission layer 209, 2010 having a substructuring being present in which the combination of different emitter materials with different basic emission spectra is provided in different zones of the mixed region.

In this connection, FIGS. 21a and 21b show a first emission layer structure 2020 and a second emission layer structure 2030 in each ease having a composition for the simple modular colour matching by means of the substructuring and FIG. 21c shows a third emission layer structure 2040 and FIG. 21c also shows a component 2070 formed precisely on the basis of the emission layer structure 2040, the component emitting white light.

Figure 26:
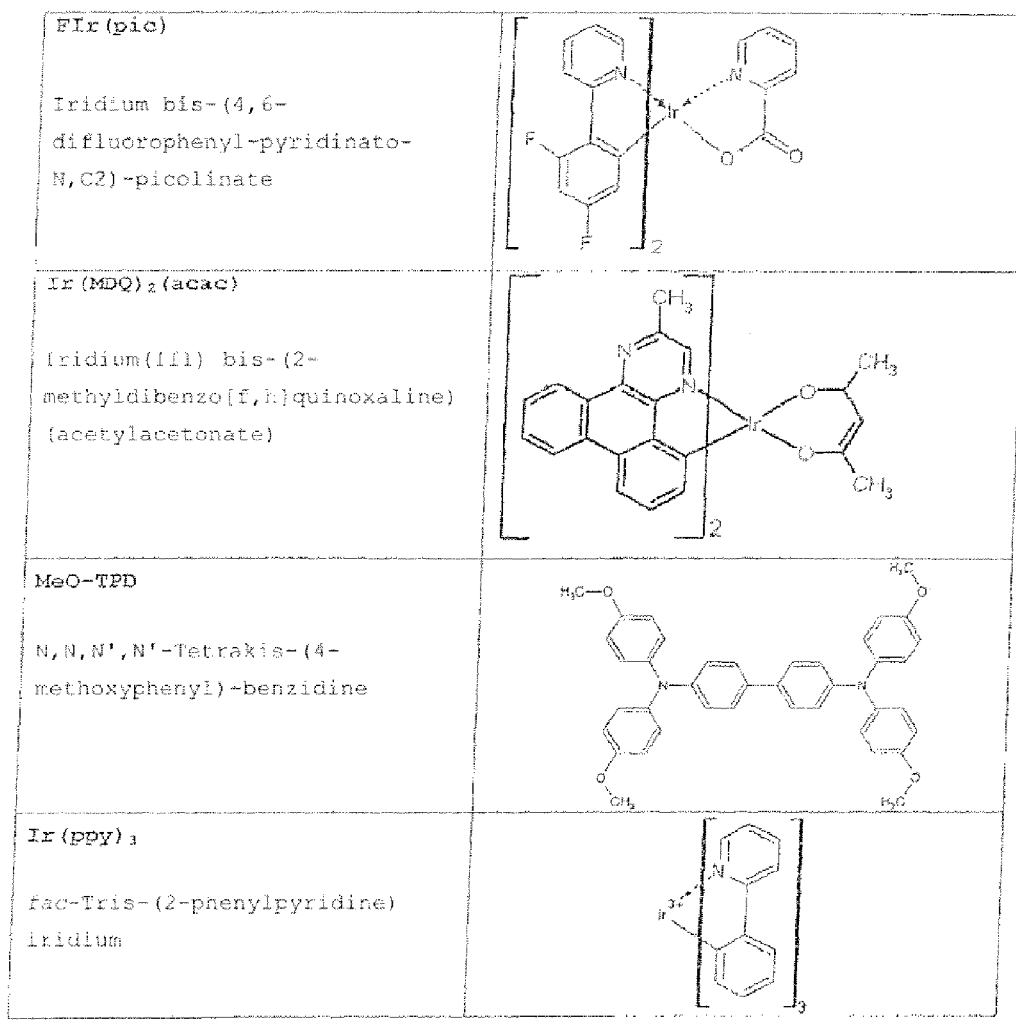

The following materials are used in the emission layer structures 2020, 2030, 2040, the chemical names of the former being indicated in FIG. 26, 27, 28. The different emission zones of the emission layer structures 2020, 2030, 2040 are shown in FIG. 21a, 21b, 21c. The schematically illustrated, associated layer structure of the complete OLED 2070 shown in FIG. 21d is constructed as follows, the reference numbers having the following meanings:

| | |
|---|---|
| 2060 | transparent ITO (indium-tin-oxide) on a glass substrate (90 nm) as the anode, |
| 2061 | MeO-TPD electrically doped with $F_4$-TCNQ, 4% by mole (60 nm), |
| 2062 | NPB (10 nm), |
| 2040 | entire emission layer structure, |
| 2063 | TPBi (10 nm), |
| 2064 | BPhen electrically doped with cesium (Cs) (40 nm), |
| 2065 | a reflecting aluminium layer (100 nm) as the cathode, the respective layer thicknesses being given in nanometers, nm. |

Instead of the emission layer structure 2040 for a white-light emission, the emission structures 2020, 2030 may be used for the generation of a matched colour emission.

The emission layer structures 2020, 2030, 2040 for the associated components 2070—OLED—are schematically illustrated in FIG. 21. These are in each case a combination of two sequentially used host materials 207, 208, the host material 207 being TCTA and the host material 208 being TPBi, the structural formulae and structural make-up of which being indicated in FIGS. 27 and 28. In the mixed zones 201, 202, 203, 204, 205, 206, the emitter dyes are introduced into the respective host material 207, 208 in each case with approx. ten percent by weight. The individual layers 201, 202, 203, 204, 205, 206 of the mixed zones are 1 nm thick, the zones of pure host material 207, 208 have a thickness of 2 nm such that the entire emission layer structures 2020, 2030 are in each case about 20 nm thick and the emission layer structure 2040 is about 27 nm thick, the emission layer structures 2020, 2030, 2040 being composed of two individual emission layers 209, 2010 of in each case 10 nm (or 7 nm in the case of 2040), the individual emission layers 209, 2010 being defined by means of the choice of the host materials 207 and 208. In this connection, the triplet energy of the host material 208, TPBi, is lower than that of the emitter dye FIr(pic) in the mixed-zone layer 204 in FIG. 21. The nature of the blue dyes accordingly also calls for host materials having increasingly higher triplet energies which results in the band gap of the transport level (HOMO-LUMO difference) also increasing. Such host materials often have the disadvantage that thus the injection of charge carriers into such a material is becoming markedly more difficult which significantly inflates the operating voltage. A compromise is achieved by a worse energy conversion efficiency for the blue colour by means of the higher triplet energy of the blue dye in comparison with the host material being provided for the emission layer structure to keep the operating voltage low and thus ensure high performance efficiencies.

FIG. 22 shows three basic electroluminescence spectra 2050, 2051, 2052 of the emitter dyes which can be measured in monochromatic emission layer structures. The monochromatic emission layer structures have the base colours, the additive combination of which achieving the matched emission spectrum 2053, 2054, in particular the white-light emission 2055.

Figure 23:
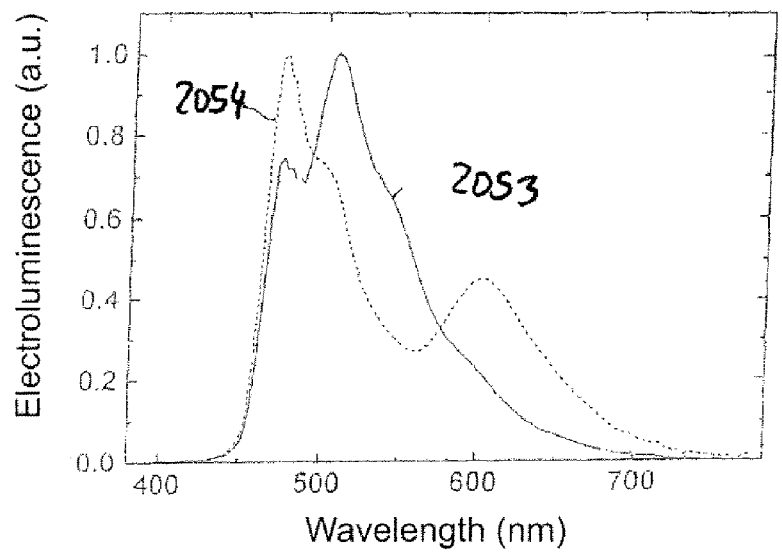

FIG. 23 shows the composed electroluminescence spectra 2053, 2054 of the emission layer structures 2020, 2030 according to FIGS. 21a and 21b. A composition of the basic spectra 2050, 2052 as well as 2050, 2052 from FIG. 22 is present in both associated emission spectra 2053, 2054. The difference in the spectral distribution of the emission layer structures 2020, 2030 according to FIG. 21a and FIG. 21b, taking the similarity of both structures 2020, 2030 into consideration, is remarkable. In comparison with the emission layer structure 2020 in FIG. 21a, in the emission layer structure 2030 according to FIG. 21b, solely a 1 nm thick mixed-layer zone which contains the green emitter Ir(ppy)3 in TPBi is replaced by a combination of 1 nm Ir(MDQ)2(acac) in TPBi. The emission which in the case of FIG. 21a lies heavily within the green colour range changes significantly to a blue-red combination in the emission layer structure 2030 according to FIG. 21b. The comparison of the emission layer structures 2020, 2030 in FIG. 21a and FIG. 21b demonstrates how easily the colour matching can be adjusted in an associated OLED when the emitter dyes can be varied in spatially separated zones in a modular manner.

Figure 24:
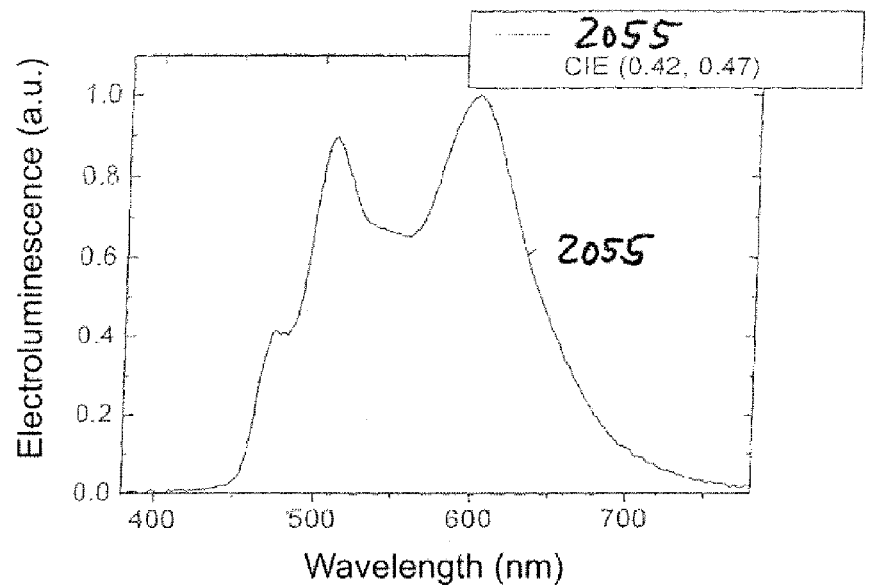

FIG. 24 shows the electroluminescence spectrum 2055 of the emission layer structure 2040 of a schematically illustrated OLED 2070. All of the spectra 2050, 2051, 2052 of the basic emitter dyes illustrated in FIG. 22 contribute to the spectrum 2055. The CIE coordinates in the CIE colour space are (0.42, 0.47) which is close to the illuminant (0.445, 0.405).

In summary, the method according to the invention for the production of a component 2070 for phosphorescent light emission from triplet states in accordance with the patent application 10 2007 033 209.4-33 with a provided emission layer structure 2020, 2030 or 2040 is performed in which a matched colour emission 2053, 2054 or a white-light emission 2055 is realised using different emitter dyes having different emission colours.

Both a white-light emission 2055 by the emission of different zones with different emission spectra 2050, 2051, 2052 and the reduction of the diffusion-based triplet-triplet annihilation can be achieved.

By means of the combinational spatial arrangement of different emitter dyes, a modular variability in the colour matching can be achieved spatially in the emission layer structure 2020, 2030, 2040 to generate light with a given spectrum in particular white light.

Figure 25:
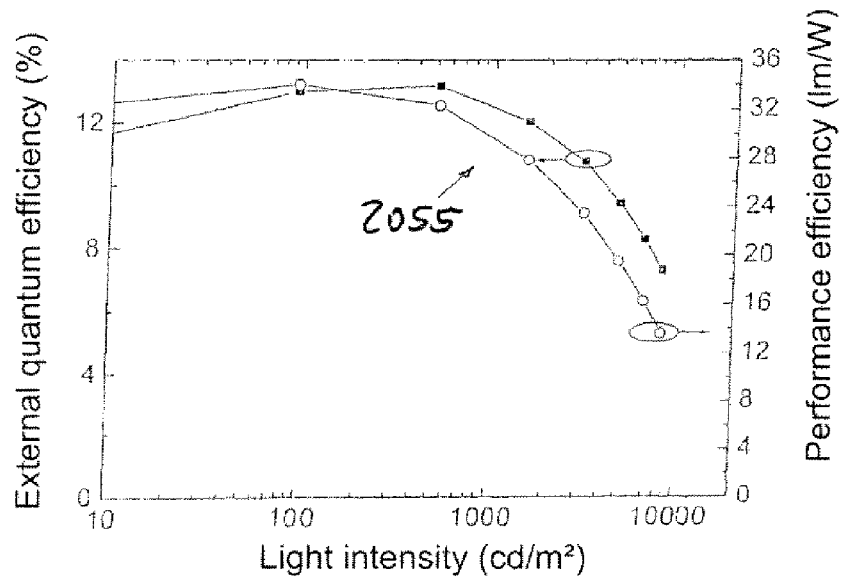

FIG. 25 shows the outer quantum efficiency and the performance efficiency of the emission layer structure 2030 of an OLED as a function of the light intensity. At light intensities of 1000 cd/m2 relevant for lighting, the emission layer structure 2040 achieves an external quantum efficiency (curve with the connected circles) of 12.5% and a performance efficiency (curve with the connected black squares) of 29.6 lm/W, measured in the forward direction, assuming a radiation diagram according to Lambert. The decrease of the performance efficiency from 100 to 1000 cd/m2 is in this case 89%. In comparison with the above-mentioned printed publication of D'Andrade, Adv. Mat. 16, 2004, p. 624, both the absolute value of the performance efficiency at 1000 cd/m2 is higher, i.e. by a factor of three, and the loss in efficiency at high light intensities is markedly reduced.

The features of the invention disclosed in the above description, the claims and the figures can be of importance both taken on their own and in any combination to implement the invention in its different embodiments.

| List of reference numbers | |
|---|---|
| 1 | Anode |
| 2 | Cathode |
| 3 | Hole transport layer |
| 4 | Light-emitting region |
| 5 | Electron transport layer |
| 6 | Hole blocking layer |
| 7 | Electron blocking layer |
| 101 | Highly conductive anode |
| 102 | Hole transport layer |
| 103 | Electron and exciton blocking layer |
| 104 | Emission layer |
| 1041 | Standard emission zone |
| 1042 | Emission layer with exciton substructures |
| 1043, 1044, 1045, 1046 | Emission layer |
| 105 | Hole and exciton blocking layer |
| 106 | Electron transport layer |
| 107 | Highly conductive cathode |
| 108 | Mixed system |
| 109 | Host material |
| 191 | Other host material |
| 1091 | Zone |
| 1010 | Component |
| 10101 | Component according to the prior art |

-continued

List of reference numbers

| | |
|---|---|
| 1011 | Emitter dye |
| 1012 | First boundary surface |
| 1013 | Second boundary surface |
| 1014, 1015, 1016, 1017, 1018, 1019, 1020, 1021, 1022, 1023, 1024, 1025 | Zone |
| 201 | Mixed layer with TCTA and Ir(MDQ)$_2$(acac) |
| 202 | Mixed layer with TCTA and Ir(ppy)$_3$ |
| 203 | Mixed layer with TCTA and FIr(pic) |
| 204 | Mixed layer with TPBi and FIr(pic) |
| 205 | Mixed layer with TPBi and Ir(ppy)$_3$ |
| 206 | Mixed layer with TPBi and Ir(MDQ)$_2$(acac) |
| 207 | First host material TCTA |
| 208 | Second host material TPBi |
| 209 | First individual emission layer |
| 210 | Second individual emission layer |
| 2020 | First entire emission layer structure |
| 2030 | Second entire emission layer structure |
| 2040 | Third entire emission layer structure |
| 2050 | First basic spectrum |
| 2051 | Second basic spectrum |
| 2052 | Third basic spectrum |
| 2053 | First composed colour spectrum |
| 2054 | Second composed colour spectrum |
| 2055 | White-light spectrum |
| 2060 | Anode |
| 2061 | Hole transport layer |
| 2062 | Electron blocker layer |
| 2063 | Hole blocker layer |
| 2064 | Electron transport layer |
| 2065 | Cathode |

The invention claimed is:

1. A light-emitting component comprising an electrode, a counter electrode, an organic region arranged between the electrode and the counter electrode, and an organic light-emitting region, wherein the region comprises at least one emission layer that emits light in one or more colour ranges within the visible spectral region upon application of an electrical voltage to the electrode and the counter electrode:
wherein the at least one emission layer comprises at least one fluorescent emitter which emits light predominantly within the blue or blue-green spectral region and at least one phosphorescent emitter emitting light predominantly within the non-blue spectral region,
wherein a triplet energy for an energy level of a triplet state in the at least one emission layer for at least one fluorescent emitter is higher than or within 0.1 eV of a triplet energy for an energy level of a triplet state of the at least one phosphorescent emitter, and
wherein the light-emitting organic region emits a proportion of at least about 5% of the generated light within the visible spectral region as fluorescent light of singlet states of the at least one fluorescent emitter in the at least one emission layer.

2. The light-emitting component according to claim 1, wherein the at least one emission layer comprises a compact layer of the at least one fluorescent emitter which serves as a matrix material, wherein the at least one phosphorescent emitter is incorporated in the compact layer.

3. The light-emitting component according to claim 1, wherein the at least one emission layer comprises an organic material into which the at least one fluorescent emitter and the at least one phosphorescent emitter are incorporated, wherein the concentration of the at least one fluorescent emitter in the organic material ranges from about 0.1 to about 50 mole percent.

4. The light-emitting component according to claim 1, wherein the organic light-emitting region emits at least 25% of the generated light within the visible spectral region as fluorescent light of singlet states of the at least one fluorescent emitter in the at least one emission layer.

5. The light-emitting component according to claim 1, wherein the organic light-emitting region comprises a second emission layer comprising at least one phosphorescent emitter which emits light predominantly within the non-blue spectral region.

6. The light-emitting component according to claim 5, wherein the at least one emission layer and the second emission layer are adjacent to one another.

7. The light-emitting component according to claim 5, wherein the at least one emission layer transports electrons and the second emission layer transports holes, wherein the at least one emission layer and the second emission layer are arranged so that a distance between a surface of the at least one emission layer facing the electrode implemented as the cathode and a surface of the cathode facing the at least one emission layer is smaller than a distance between a surface of the second emission layer facing the cathode and a surface of the cathode facing the further emission layer.

8. The light-emitting component according to claim 5, wherein the at least one emission layer transports holes and the second emission layer transports electrons, wherein the at least one emission layer and the second emission layer are arranged so that a distance between a surface of the at least one emission layer facing the electrode implemented as the anode and a surface of the anode facing the at least one emission layer is smaller than a distance between a surface of the second emission layer facing the anode and a surface of the anode facing the second emission layer.

9. The light-emitting component according to claim 5, wherein the at least one emission layer and/or the second emission layer comprise several layers.

10. The light-emitting component according to claim 1, wherein at least one fluorescent emitter in the at least one emission layer comprises an organo-metallic compound or a complex compound comprising a metal having an atomic number of less than 40.

11. The light-emitting component according to claim 1, wherein the at least one emission layer comprises a spatial area with a first concentration of the at least one phosphorescent emitter and a second spatial area with a second concentration of the at least one phosphorescent emitter, wherein the second concentration differs from the first concentration.

12. The light-emitting component according to claim 1, wherein the at least one emission layer comprises a spatial area free from any admixture of the at least one phosphorescent emitter.

* * * * *